United States Patent
Jun et al.

(10) Patent No.: US 10,866,663 B2
(45) Date of Patent: Dec. 15, 2020

(54) DISPLAY DEVICE WITH INTEGRATED TOUCH SCREEN AND METHOD FOR FABRICATING THE SAME

(71) Applicant: LG Display Co., Ltd., Seoul (KR)

(72) Inventors: Changhwa Jun, Seoul (KR); JongSung Kim, Paju-si (KR); Ho-Jin Kim, Seoul (KR); Jaehyung Yu, Paju-si (KR); SeungMin Baik, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/835,676

(22) Filed: Dec. 8, 2017

(65) Prior Publication Data

US 2018/0164933 A1 Jun. 14, 2018

(30) Foreign Application Priority Data

Dec. 8, 2016 (KR) .................. 10-2016-0166961

(51) Int. Cl.
| | |
|---|---|
| *G06F 3/041* | (2006.01) |
| *H01L 27/32* | (2006.01) |
| *H01L 51/52* | (2006.01) |
| *G09G 3/3258* | (2016.01) |
| *H01L 51/00* | (2006.01) |
| *G06F 3/044* | (2006.01) |

(52) U.S. Cl.
CPC ............ *G06F 3/0412* (2013.01); *G06F 3/044* (2013.01); *G06F 3/0416* (2013.01); *G09G 3/3258* (2013.01); *H01L 27/323* (2013.01); *H01L 51/0023* (2013.01); *H01L 51/5203* (2013.01); *H01L 51/5237* (2013.01); *H01L 51/5253* (2013.01); *G06F 2203/04112* (2013.01)

(58) Field of Classification Search
CPC ...... G06F 3/044; G06F 3/0412; G06F 3/0416; H01L 51/0023; H01L 51/5237
See application file for complete search history.

(56) References Cited

U.S. PATENT DOCUMENTS

| | | | |
|---|---|---|---|
| 2016/0132148 A1* | 5/2016 | Han | G06F 3/044 345/174 |
| 2016/0320885 A1* | 11/2016 | Kim | G06F 3/0412 |
| 2018/0032189 A1* | 2/2018 | Lee | G06F 3/0412 |
| 2018/0039360 A1* | 2/2018 | Akimoto | G06F 3/0412 |
| 2018/0149920 A1* | 5/2018 | Yamazaki | G02F 1/13338 |

* cited by examiner

Primary Examiner — Dennis P Joseph
(74) Attorney, Agent, or Firm — Birch, Stewart, Kolasch & Birch, LLP

(57) ABSTRACT

Disclosed is a display device with integrated touch screen capable of minimizing the increase of thickness caused by touch electrodes, and a method for fabricating the same, wherein the display device may include first electrode on a first substrate, an organic light emitting layer on the first electrode, a second electrode on the organic light emitting layer, and an encapsulation film on the second electrode, wherein the encapsulation film includes a touch sensing layer with a first touch electrode, a second touch electrode, and a first insulating film, the first touch electrode, the second touch electrode, and the first insulating film are coplanar, and the first insulating film is disposed between the first touch electrode and the second touch electrode.

17 Claims, 24 Drawing Sheets

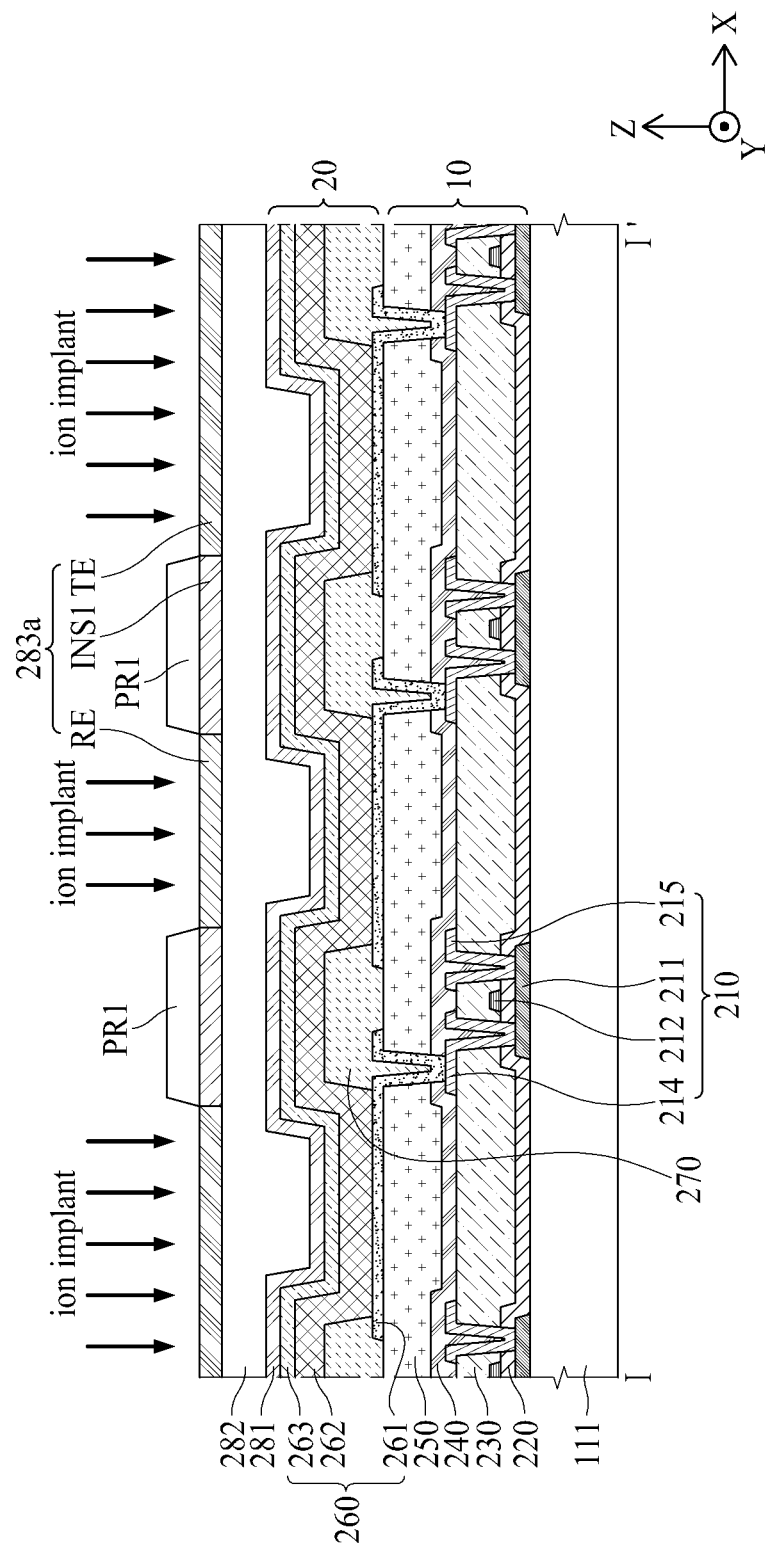

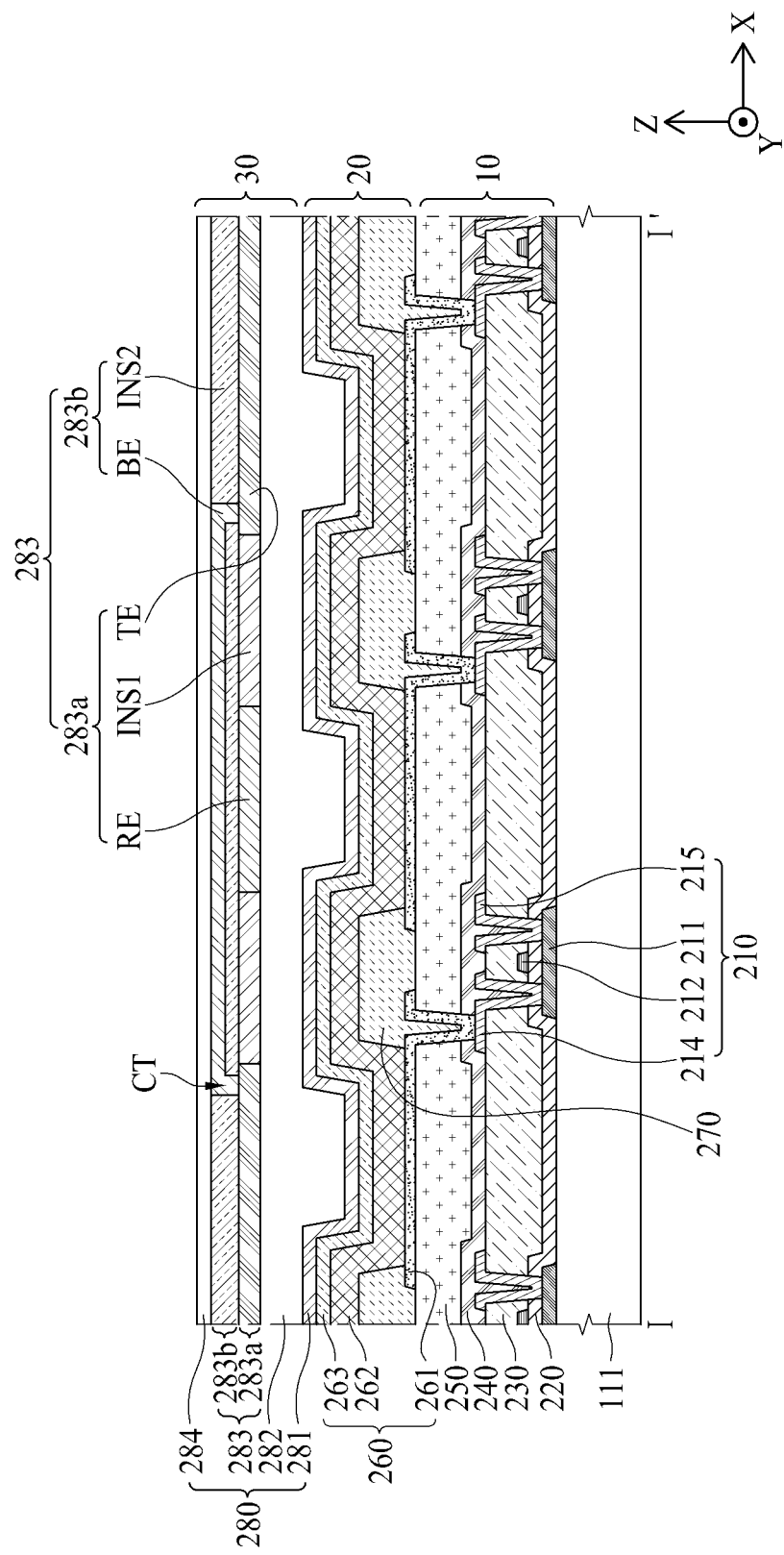

DISPLAY DEVICE WITH INTEGRATED TOUCH SCREEN AND METHOD FOR FABRICATING THE SAME

CROSS REFERENCE TO RELATED APPLICATION

This application claims the benefit of the Korean Patent Application No. 10-2016-0166961 filed on Dec. 8, 2016, the entire contents of which are incorporated herein by reference in its entirety.

BACKGROUND OF THE INVENTION

Field of the Invention

Embodiments of the present invention relate to a display device with an integrated touch screen, and a method for fabricating the same.

Description of the Related Art

With the advancement of an information-oriented society, various requirements for the display device of displaying an image are increasing. Thus, there are various display devices of liquid crystal display (LCD) devices, plasma display panel (PDP) devices, organic light emitting display (OLED) devices, etc. Among these display devices, the OLED device has advantages of low-voltage driving, thin profile, wide viewing angle, and rapid response speed.

The OLED device may include a display panel having data lines, scan lines, and a plurality of pixels provided every intersection of the data and scan lines, a scan driver for supplying scan signals to the scan lines, and a data driver for supplying data voltages to the data lines. Each of the pixels may include an organic light emitting diode, a driving transistor for controlling an amount of current supplied to the organic light emitting diode in accordance with a voltage of a gate electrode, and a scan transistor for supplying the data voltage of the data line to the gate electrode of the driving transistor in response to the scan signal of the scan line.

Recently, the OLED device may be formed in a display device with integrated touch screen including a touch screen panel capable of sensing a user's touch. In this instance, the OLED device may function as a touch screen apparatus. Recently, the touch screen apparatus is widely applied to home appliances such as refrigerator, microwave and washing machine as well as monitors for navigation, industrial terminal, notebook computer, banking automation device and game console, and mobile terminals such as smart phone, tablet, mobile phone, MP3, PDA, PMP, PSP, mobile game console, DMB receiver and tablet PC. Also, the touch screen apparatus has become widely used due to an easy operation.

In the display device with integrated touch screen, there are Tx electrodes and Rx electrodes in a display panel. For example, Tx electrodes, Rx electrodes, and a bridge electrode for connecting the Tx and Rx electrodes with each other are formed on an encapsulation film for encapsulating an organic light emitting device. However, it may cause a problem related with an increased thickness of the display device with an integrated touch screen.

SUMMARY OF THE INVENTION

Accordingly, embodiments of the present invention are directed to a display device with an integrated touch screen that substantially obviate one or more problems due to limitations and disadvantages of the related art, and a method for fabricating the same.

An aspect of embodiments of the present invention is directed to provide a display device with an integrated touch screen capable of minimizing the increase of thickness caused by touch electrodes, and a method for fabricating the same.

Additional advantages and features of embodiments of the invention will be set forth in part in the description which follows and in part will become apparent to those having ordinary skill in the art upon examination of the following or may be learned from practice of embodiments of the invention. The objectives and other advantages of the embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a display device with an integrated touch screen that may include a first electrode on a first substrate, an organic light emitting layer on the first electrode, a second electrode on the organic light emitting layer, and an encapsulation film on the second electrode, wherein the encapsulation film includes a first touch sensing layer with a first touch electrode, a second touch electrode, and a first insulating film, the first touch electrode, the second touch electrode, and the first insulating film are coplanar, and the first insulating film is disposed between the first touch electrode and the second touch electrode.

In another aspect of an embodiment of the present invention, there is provided a display device with an integrated touch screen that may include a first electrode on a first substrate, an organic light emitting layer on the first electrode, a second electrode on the organic light emitting layer, and an encapsulation film on the second electrode, wherein the encapsulation film includes a first touch sensing layer with a first touch electrode and a first insulating film disposed at a first layer, an insulating film disposed on the first touch sensing layer, and a second touch sensing layer with a second touch electrode and a second insulating film disposed at a second layer, wherein the second touch sensing layer is disposed on the insulating film, wherein the first insulating film is disposed between the first touch electrode and another neighboring first touch electrode, and the second insulating film is disposed between the second touch electrode and another neighboring second touch electrode.

In another aspect of an embodiment of the present invention, there is provided a method for fabricating a display device with an integrated touch screen that may include forming a first electrode on a first substrate, forming an organic light emitting layer on the first electrode, and forming a second electrode on the organic light emitting layer, and forming an encapsulation film on the second electrode, wherein the process of forming the encapsulation film includes forming a first non-conductive layer, forming a first touch sensing layer including first and second touch electrodes by forming a first photoresist pattern on the first non-conductive layer, and making the first non-conductive layer, which is not covered by the first photoresist pattern, be a conductive layer through an ion implantation process, removing the first photoresist pattern, and forming a second non-conductive layer on the first touch sensing layer, forming a contact portion of a bridge electrode by forming a second photoresist pattern on the second non-conductive layer, and making the second non-conductive layer, which is not covered by the second photoresist pattern, be a conductive layer through an ion implantation process, completing the bridge electrode by removing the second photoresist pattern, forming a third photoresist pattern on the second non-conductive layer, and making the second non-conductive layer, which is not covered by the third photoresist pattern, be a conductive layer through an ion implantation process, and removing the third photoresist pattern.

It is to be understood that both the foregoing general description and the following detailed description of embodiments of the present invention are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 11A to 11G are cross sectional views illustrating one example of operation S102;

DETAILED DESCRIPTION OF THE EMBODIMENTS

Figure 1:
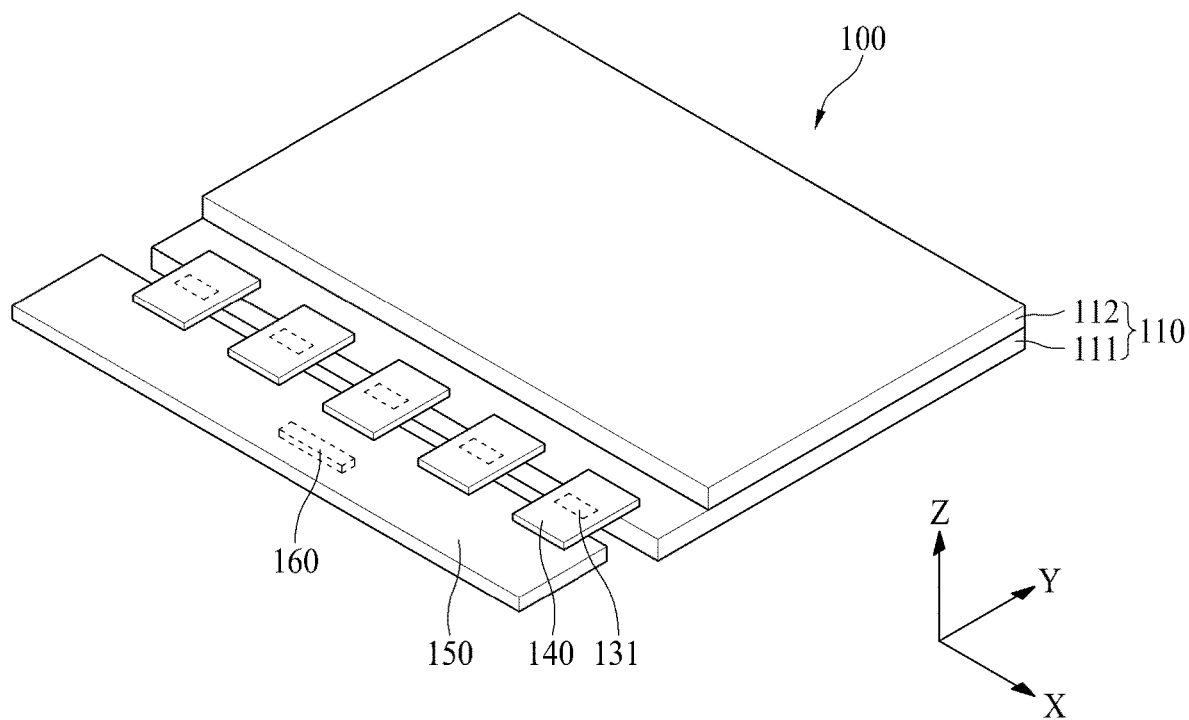
FIG. 1 is a perspective view illustrating a display device with integrated touch screen according to one embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', an instance which is not contact may be included unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a display device with integrated touch screen according to the embodiment of the present invention and a method for fabricating the same will be described with reference to the accompanying drawings.

Figure 2:
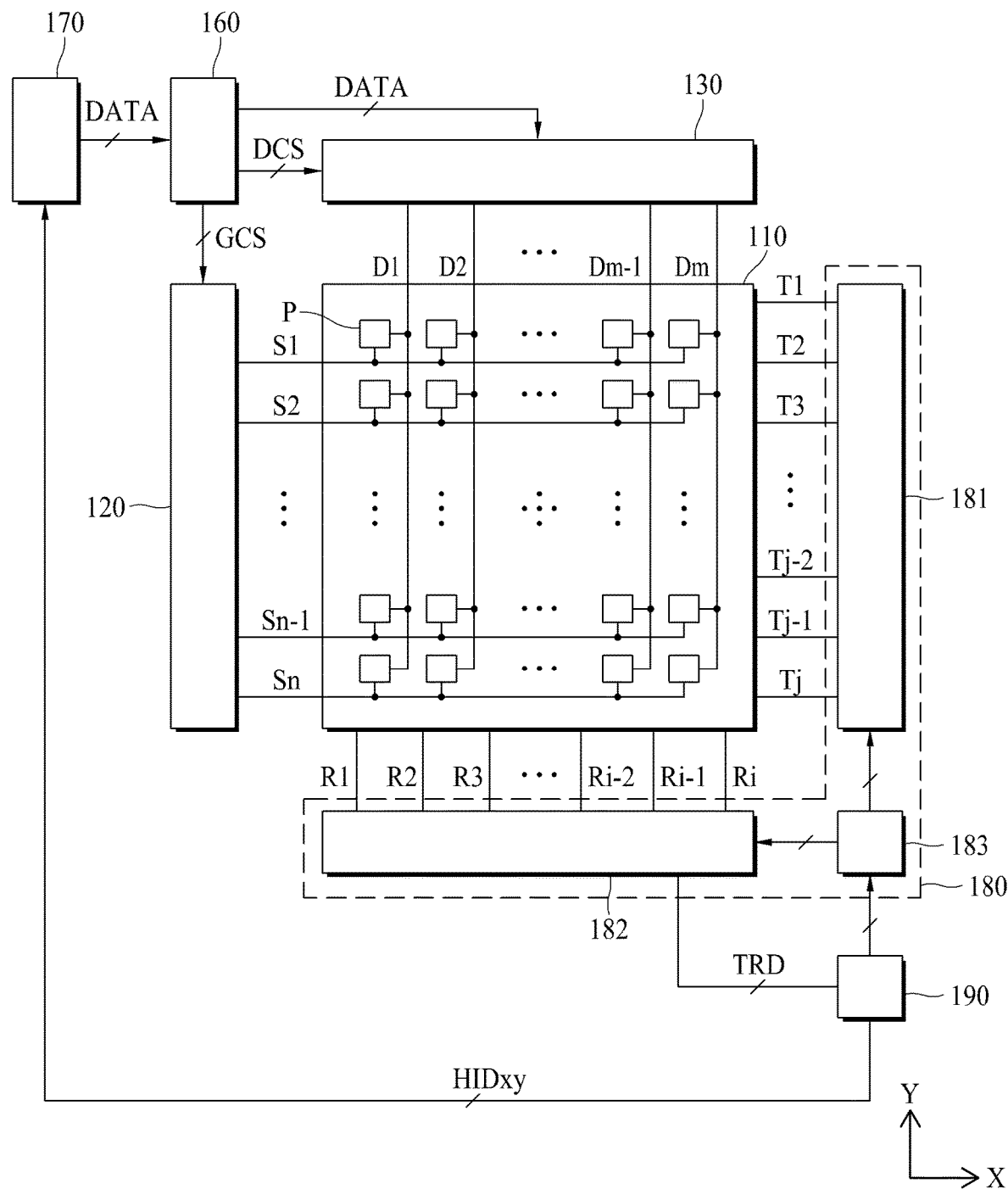
FIG. 2 is a block diagram illustrating the display device with integrated touch screen according to one embodiment of the present invention.

FIG. 1 is a perspective view illustrating a display device with integrated touch screen according to one embodiment of the present invention. FIG. 2 is a block diagram illustrating the display device with integrated touch screen according to one embodiment of the present invention.

Referring to FIGS. 1 and 2, the display device 100 with integrated touch screen according to one embodiment of the present invention may include a display panel 110, a scan driver 120, a data driver 130, a timing controller 160, a host system 170, a touch driver 180, and a touch coordinates calculator 190.

The display device with integrated touch screen according to the embodiment of the present invention may be realized in various flat display devices, for example, liquid crystal display (LCD) device, field emission display (FED) device, plasma display panel (PDP), organic light emitting display (OLED) device, electrophoresis (EPD) device, and etc. Hereinafter, the display device with integrated touch screen according to the embodiment of the present invention is realized in the OLED device, but is not limited to this type.

The display panel 110 includes a first substrate 111 and a second substrate 112. The second substrate 112 may be an encapsulation substrate, and the first substrate 111 may be a plastic film or a glass substrate. The second substrate 112 may be a plastic film, a glass substrate, or an encapsulation film (protection film).

The display panel 110 includes a display area with pixels (P) prepared to display an image. The display panel 110 may include data lines (D1~Dm, 'm' is an integer of 2 or more than 2), and scan lines (S1~Sn, 'n' is an integer of 2 or more than 2). The data lines (D1~Dm) may intersect with the scan lines (S1~Sn). Herein, the pixels (P) may be formed at respective intersection areas defined by the gate and data lines crossing each other.

Each of the pixels (P) of the display panel 110 may be connected with any one of the data lines (D1~Dm) and any one of the scan lines (S1~Sn). Each of the pixels (P) of the display panel 110 may include a driving transistor for controlling a drain-to-source current in accordance to a data voltage supplied to a gate electrode, a scan transistor for supplying the data voltage of the data line to the gate electrode of the driving transistor, wherein the scan transistor is turned-on by a scan signal of the scan line, an organic light emitting diode which emits light in accordance with the drain-to-source current of the driving transistor, and a capacitor for storing the voltage in the gate electrode of the driving transistor. Thus, each of the pixels (P) may emit light in accordance with a current supplied to the organic light emitting diode.

The scan driver 120 receives a scan control signal (GCS) from the timing controller 160. The scan driver 10 supplies the scan signals to the scan lines (S1~Sn) in accordance with the scan control signal (GCS).

The scan driver 120 may be disposed in a non-display area at one peripheral side or both peripheral sides of the display area of the display panel 110 by a gate driver in panel (GIP) method. In another way, the scan driver 120 may be fabricated in a driving chip, and mounted on a flexible film, wherein the scan driver 120 of the driving chip may be attached to the non-display area at one peripheral side or both peripheral sides of the display area of the display panel 110 by a tape automated bonding (TAB) method.

The data driver 130 receives digital video data (DATA) and data control signal (DCS) from the timing controller 160. The data driver 130 converts the digital video data (DATA) to an analog positive/negative data voltage in accordance with the data control signal (DCS), and supplies the analog positive/negative data voltage to the data lines. That is, the pixels to be supplied with the data voltages are selected by the scan signals of the scan driver 120, and the data voltages are supplied to the selected pixels.

As shown in FIG. 1, the data driver 130 may include a plurality of source drive ICs 131. Each of the plurality of source drive ICs 131 may be mounted on a flexible film 140 by a chip on film (COF) or chip on plastic (COP) method. The flexible film 140 is attached onto pads prepared in the non-display area of the display panel 110 by the use of anisotropic conducting film, whereby the plurality of source drive ICs 131 may be connected with the pads.

A circuit board 150 may be attached to the flexible films 140. A plurality of circuits formed of driving chips may be mounted on the circuit board 150. For example, the timing controller 160 may be mounted on the circuit board 150. The circuit board 150 may be a printed circuit board or a flexible printed circuit board.

The timing controller 160 receives the digital video data (DATA) and timing signals from the host system 170. The timing signals may include a vertical synchronization signal, a horizontal synchronization signal, a data enable signal, a dot clock, and etc. The vertical synchronization signal defines 1 frame period. The horizontal synchronization signal defines 1 horizontal period needed to supply the data voltages to the pixels for 1 horizontal line of the display panel (DIS). The data enable signal defines a period of inputting valid data. The dot clock is a signal which is repeated every preset short time period.

In order to control an operation timing of each of the scan driver 120 and the data driver 130, the timing controller 160 generates a data control signal (DCS) for controlling the operation timing of the data driver 130, and a scan control signal (GCS) for controlling the operation timing of the scan driver 120 on the basis of timing signals. The timing controller 160 outputs the scan control signal (GCS) to the scan driver 120, and outputs the digital video data (DATA) and the data control signal (DCS) to the data driver 130.

The host system 170 may be realized in a navigation system, a set top box, a DVD player, a blu-ray player, a personal computer (PC), a home theater system, a broadcasting receiver, a phone system, and etc. The host system 170 includes a SoC (system on chip) with a scaler, which enables to convert the digital video data (DATA) of input image into a format appropriate for the display on the display panel (DIS). The host system 170 transmits the digital video data (DATA) and timing signals to the timing controller 160.

On the display panel 10, there are first touch electrodes, and second touch electrodes as well as the data lines (D1~Dm) and the scan lines (S1~Sn). The first touch electrodes may intersect with the second touch electrodes. The first touch electrodes may be connected with a first touch driver 181 through first touch lines (T1~Tj, 'j' is an integer of 2 or more than 2). The second touch electrodes may be connected with a second touch driver 182 through second touch lines (R1~Ri, 'i' is an integer of 2 or more than 2). Touch sensors may be formed at respective intersections of the first touch electrodes and the second touch electrodes. According to the embodiment of the present invention, each of the touch sensors according to the embodiment of the present invention may be realized by a mutual capacitance, but is not limited to this type. The first and second touch electrodes will be described in detail with reference to FIG. 4.

The touch driver 180 supplies a driving pulse to the first touch electrodes through the first touch lines (T1~Tj), and senses the change of charge amount in each of the touch sensors through the second touch lines (R1~Ri). That is, in FIG. 2, the first touch lines (T1~Tj) correspond to Tx lines for supplying the driving pulse, and the second touch lines (R1~Ri) correspond to Rx lines for sensing the change of charge amount in each of the touch sensors.

The touch driver 180 includes the first touch driver 181, the second touch driver 182, and a touch controller 183. The first touch driver 181, the second touch driver 182, and the touch controller 183 may be integrated in one read-out IC (ROIC).

The first touch driver 181 selects the first touch line to be supplied with the driving pulse under control of the touch controller 183, and supplies the driving pulse to the selected first touch line. For example, the first touch driver 181 may supply the driving pulses to the first touch lines (T1~Tj) in sequence.

The second touch driver 182 selects the second touch lines to be received with the change of charge amount in the touch sensors under control of the touch controller 183, and receives the change of charge amount in the touch sensors through the selected second touch lines. For example, the second touch driver 182 may sample the change of charge amount in the touch sensors, which is received through the second touch lines (R1~Ri), and convert the sampled change of charge amount into touch raw data (TRD) corresponding to digital data.

The touch controller 183 may generate a TX setup signal for setting the first touch line to be supplied with the driving pulse by the first touch driver 181, and a Rx setup signal for setting the second touch line to be received with a touch sensor voltage by the second touch driver 182. Also, the touch controller 183 generates timing signals for controlling an operation timing of each of the first touch driver 181 and the second touch driver 182.

The touch coordinates calculator 190 receives the touch raw data (TRD) from the touch driver 180. The touch coordinates calculator 190 calculates the touch coordinates in accordance with a touch coordinates calculation method, and outputs touch coordinates data (HIDxy) including the touch coordinates information to the host system 170.

The touch coordinates calculator 190 may be realized in a micro controller unit (MCU). The host system 170 analyzes the touch coordinates data (HIDxy) which is provided from the touch coordinates calculator 190, and executes an application program linked with the coordinates of a user's touch based on the analyzed data result. The host system 170 transmits the digital video data (DATA) and timing signals to the timing controller 160 in accordance with the executed application program.

The touch driver 180 may be included in the source drive ICs 131, or may be fabricated in an additional driving chip and mounted on the circuit board 150. Also, the touch coordinates calculator 190 may be fabricated in a driving chip and mounted on the circuit board 150.

Figure 3:
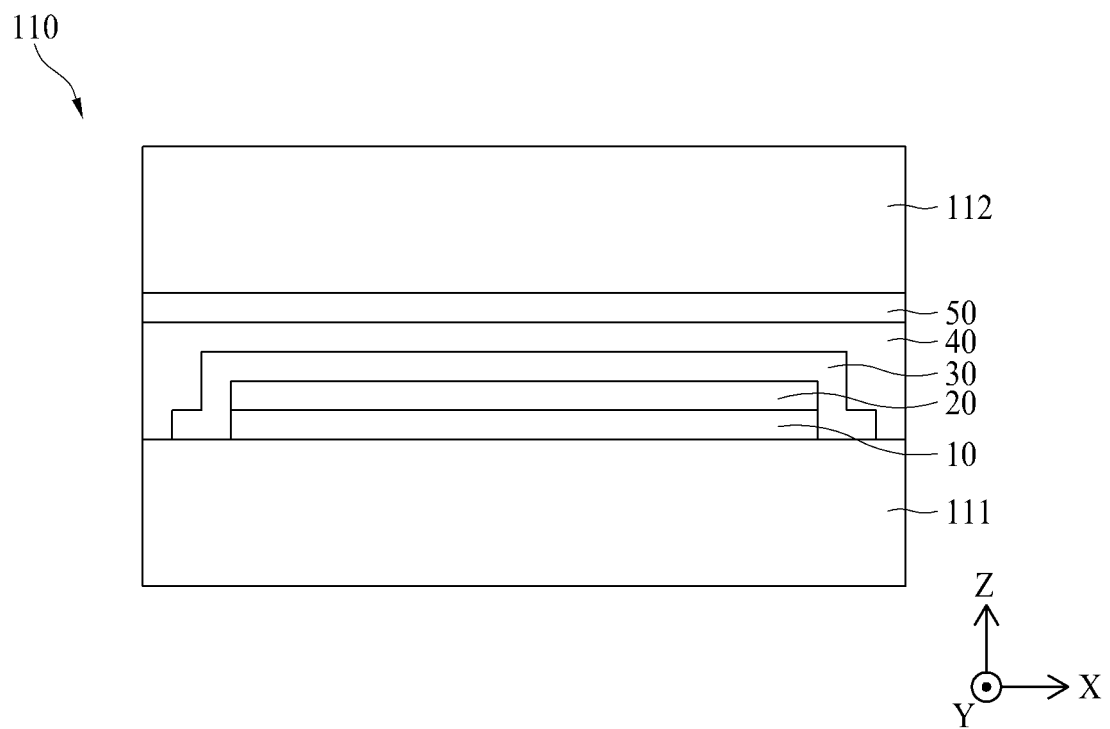
FIG. 3 is a cross sectional view illustrating one lateral side of a display panel of FIG. 1.

FIG. 3 is a cross sectional view illustrating one lateral side of the display panel of FIG. 1.

Referring to FIG. 3, the display panel 110 may include the first and second substrates 111 and 112, a thin film transistor layer 10 disposed between the first and second substrates 111 and 112, an organic light emitting device layer 20, an encapsulation layer 30, an adhesive layer 40, and a color filter layer 50.

The first substrate 111 may be a plastic film or a glass substrate.

The thin film transistor layer 10 is formed on the first substrate 111. The thin film transistor layer 10 may include scan lines, data lines, and thin film transistors. Each of the thin film transistors may include a gate electrode, a semiconductor layer, and source and drain electrodes. If the scan driver is formed in a gate driver in panel (GIP) method, the scan driver may be formed together with the thin film transistor layer 10. A detailed description of the thin film transistor layer 10 will be shown with reference to FIG. 5.

The organic light emitting device layer 20 is formed on the thin film transistor layer 10. The organic light emitting device layer 20 may include first electrodes, organic light emitting layers, second electrodes, and banks. Each of the organic light emitting layers may include a hole transporting layer, a light emitting layer, and an electron transporting layer. In this instance, if a voltage is applied to the first and second electrodes, hole and electron are transferred to the light emitting layer through the hole transporting layer and the electron transporting layer, and are then combined in the light emitting layer, to thereby emit light. The pixels are prepared in an area for the organic light emitting layer 20, and the area for the organic light emitting layer 20 may be defined as a display area, and a peripheral area of the display panel may be defined as the non-display area. The organic light emitting layer 20 will be described in detail with reference to FIG. 5.

The encapsulation layer 30 is formed on the organic light emitting layer 20. The encapsulation layer 30 prevents moisture or oxygen from being permeated into the organic light emitting device layer 20. The encapsulation layer 30 may include at least one inorganic film. The encapsulation layer 30 may include a touch sensing layer including the first and second touch electrodes so as to sense a user's touch. That is, the touch sensing layer for sensing a user's touch is provided in the encapsulation layer 30 so that it is possible to minimize the increase of thickness in the display device with integrated touch sensor caused by the touch sensing layer. A plane structure of the touch sensing layer of the encapsulation layer 30 will be described in detail with reference to FIG. 4. A cross sectional structure of the encapsulation layer 30 will be described in detail with reference to FIG. 5.

The transparent adhesive layer 40 is formed on the encapsulation layer 30. The adhesive layer 40 adheres the first substrate 111 with the thin film transistor layer 10, the organic light emitting device layer 20, and the encapsulation layer 30 to the second substrate 112. The adhesive layer 40 may be a transparent optically clear resin layer (OCR) or a transparent optically clear adhesive film (OCA).

The color filter layer 50 is formed on the second substrate 112. The color filter layer 50 may include color filters and a black matrix. If the organic light emitting device layer 20 includes red, green, and blue organic light emitting layers, it is possible to omit the color filter layer 50. The color filter layer 50 will be described in detail with reference to FIG. 5.

The second substrate 112 functions as a cover substrate or a cover window for covering the first substrate 111. The second substrate 112 may be a plastic film, a glass substrate, or an encapsulation film (protection film).

Figure 4:
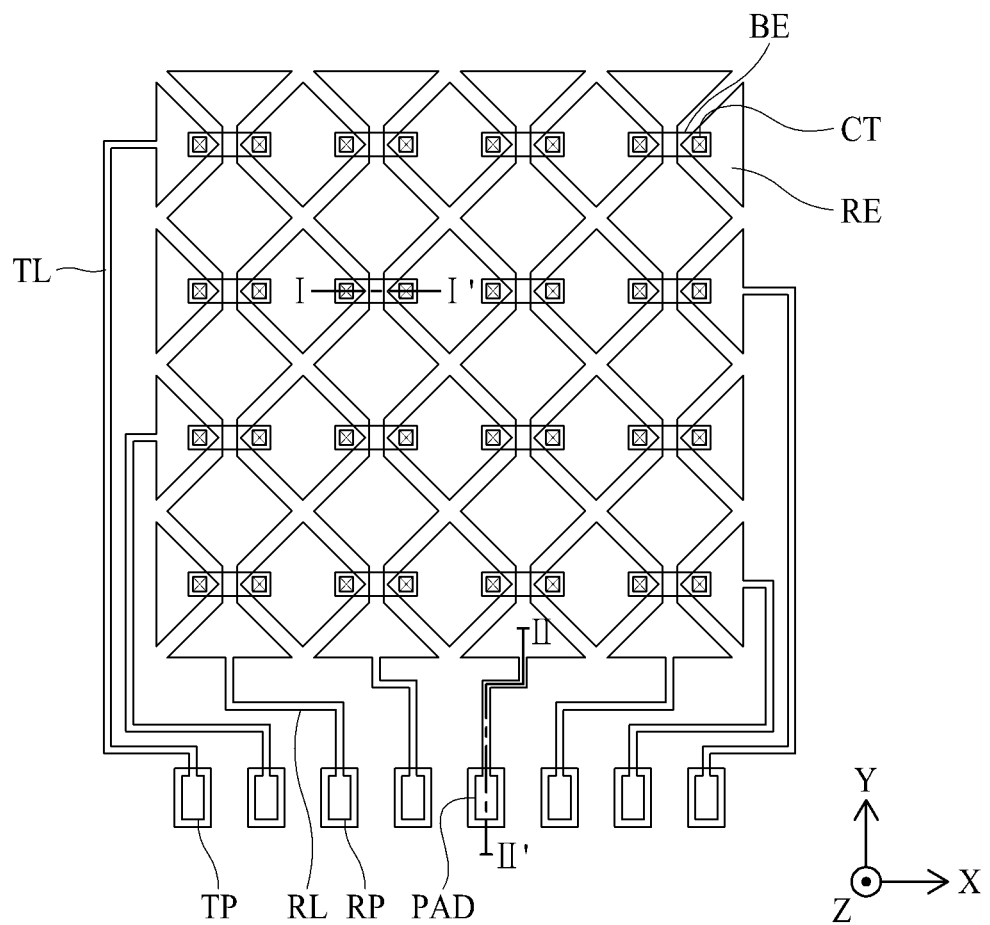
FIG. 4 is a plane view illustrating some of touch lines and touch electrodes in the display device with integrated touch screen of FIG. 1.

FIG. 4 is a plane view illustrating some of the touch lines and the touch electrodes in the display device with integrated touch screen of FIG. 1.

Referring to FIG. 4, the first touch electrodes (TE) arranged in the first direction (X-axis direction) are connected with one another, and the second touch electrodes (RE) arranged in the second direction (Y-axis direction) are connected with one another. The first direction (X-axis direction) may be parallel to the scan lines (S1~Sn) and the second direction (Y-axis direction) may be parallel to the data lines (D1~Dm), or the first direction (X-axis direction) may be parallel to the data lines (D1~Dm) and the second direction (Y-axis direction) may be parallel to the scan lines (S1~Sn).

In order to prevent the first touch electrodes (TE) and the second touch electrodes (RE) from being disconnected from each other at their intersections, the first touch electrodes (TE) neighboring in the first direction (X-axis direction) may be electrically connected with one another by a bridge electrode (BE). The bridge electrode (BE) may be disposed in the different layer from the first and second touch electrodes (TE, RE), and the bridge electrode (BE) may be connected with the adjacent first touch electrodes (TE) through contact portions (CT). The bridge electrode (BE) may intersect the second touch electrode (RE).

Each of the first touch electrodes (TE) connected in the first direction (X-axis direction) is electrically insulated from the first touch electrodes (TE) neighboring in the second direction (Y-axis direction). Each of the second touch electrodes (RE) connected in the second direction (Y-axis direction) is electrically insulated from the second touch electrodes (RE) neighboring in the first direction (X-axis direction).

Accordingly, a mutual capacitance corresponding to the touch sensor may be formed in the intersection of the first and second touch electrodes (TE, RE).

The first touch electrode (TE) which is disposed at the end of one side among the first touch electrodes (TE) connected with one another in the first direction (X-axis direction) may be connected with the first touch line (TL). The first touch line (TL) may be connected with the first touch driver 181 through the use of a pad (PAD), such as a first touch pad (TP). Accordingly, the first touch electrodes (TE) connected with one another in the first direction (X-axis direction) may receive the driving pulse from the first touch driver 181 through the first touch line (TL).

The second touch electrode (RE) which is disposed at the end of one side among the second touch electrodes (RE) connected with one another in the second direction (Y-axis direction) may be connected with the second touch line (RL). The second touch line (RL) may be connected with the second touch driver 182 through the use of a pad (PAD), such as a second touch pad (RP). Accordingly, the second touch driver 182 may receive the change of charge amount in the touch sensors of the second touch electrodes (RE) connected with one another in the second direction (Y-axis direction).

Figure 5:
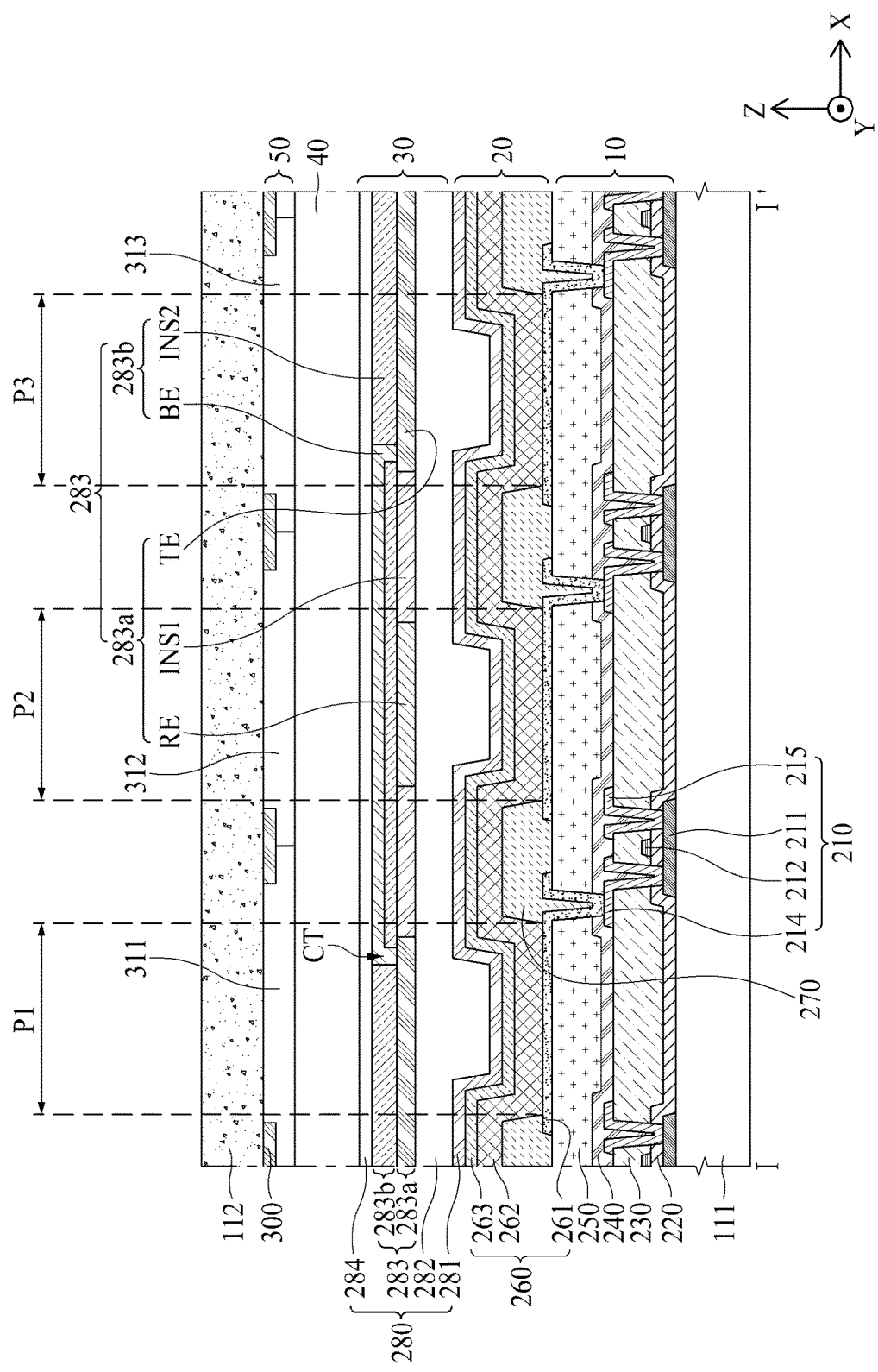
FIG. 5 is a cross sectional view illustrating one example along I-I' of FIG. 4.
Figure 6:
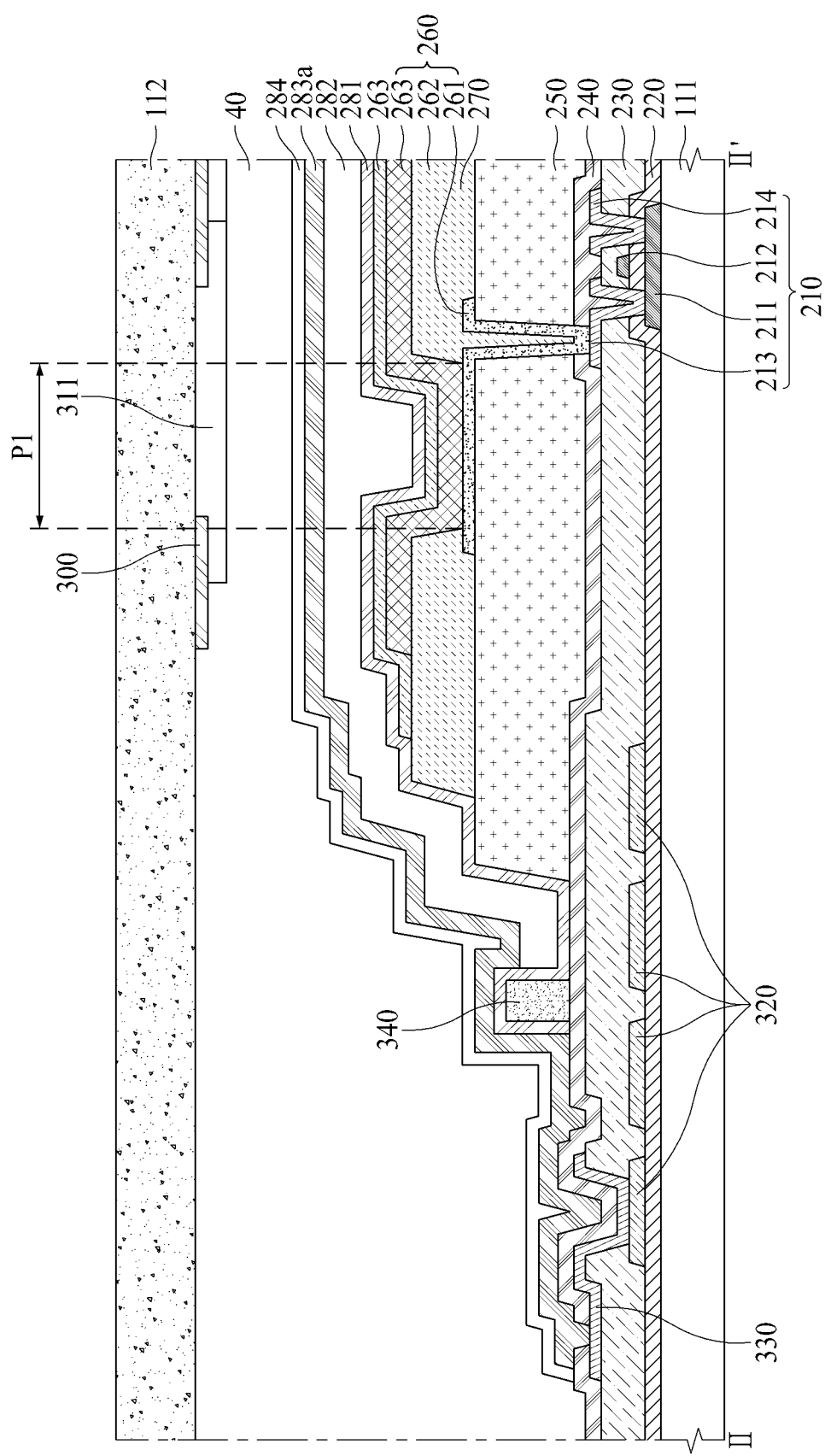
FIG. 6 is a cross sectional view illustrating one example along II-II' of FIG. 4.

FIG. 5 is a cross sectional view illustrating one example along of I-I' of FIG. 4. FIG. 6 is a cross sectional view illustrating one example along of FIG. 4.

Referring to FIG. 5, the thin film transistor layer 10 is formed on the first substrate 111. The thin film transistor layer 10 includes thin film transistors 210, a gate insulating film 220, an insulating interlayer 230, a protection film 240, and a planarization film 250.

A buffer film is formed on one surface of the first substrate 111. The buffer film is provided on one surface of the first substrate 111 so as to protect the thin film transistors 210 and organic light emitting devices 260 from moisture permeating through the first substrate 111 which is vulnerable to moisture permeability. Herein, one surface of the first substrate 111 may confront the second substrate 112. The buffer film may be formed of a plurality of inorganic films alternately deposited. For example, the buffer film may be formed in a multi-layered structure by alternately depositing at least one inorganic film from a silicon oxide film (SiOx), a silicon nitride film (SiNx), and silicon oxynitride (SiON). It is possible to omit the buffer film.

The thin film transistor 210 is provided on the buffer film. The thin film transistor 210 includes an active layer 211, a gate electrode 212, a source electrode 215, and a drain electrode 214. In FIG. 5, the thin film transistor 210 is provided in a top gate type where the gate electrode 212 is positioned above the active layer 211, but is not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film. The active layer 211 may be formed of a silicon-based semiconductor material or an oxide-based semiconductor material. A light shielding layer may be additionally provided between the buffer film and the active layer 211 so as to block external light being incident on the active layer 211.

The gate insulating film 220 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 and gate line may be provided on the gate insulating film 220. The gate electrode 212 and gate line may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

The insulating interlayer 230 may be provided on the gate electrode 212 and gate line. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

The source electrode 215, the drain electrode 214, and the data line may be provided on the insulating interlayer 230. Each of the source electrode 214 and the drain electrode 214 may be connected with the active layer 211 via a contact hole penetrating through the gate insulating film 220 and the insulating interlayer 230. The source electrode 215, the drain electrode 214, and the data line may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

The protection film 240 for an insulation of the thin film transistor 210 may be provided on the source electrode 215, the drain electrode 214, and the data line. The protection film 240 may be formed in a single-layered structure of the inorganic material such as silicon oxide (SiOx) or silicon nitride (SiNx), or a multi-layered structure of the above silicon oxide (SiOx) and silicon nitride (SiNx).

The planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

The organic light emitting device layer 20 is formed on the thin film transistor layer 10, wherein the organic light emitting device layer 20 includes the organic light emitting devices 260 and bank 270.

The organic light emitting devices 260 and bank 270 are provided on the planarization film 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be provided on the planarization film 250. The first electrode 261 may be connected with the source electrode 215 of the thin film transistor 210 via a contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of silver (Ag), palladium (Pd), and copper (Cu).

The bank 270 is provided to cover the edge of the first electrode 261 on the planarization film 250, to thereby divide the pixels (P1, P2, P3). That is, the bank 270 functions as a pixel defining film so as to define the pixels (P1, P2, P3).

Each of the pixels (P1, P2, P3) indicates a light-emission area, wherein the first electrode 261 corresponding to the anode electrode, the organic light emitting layer, and the second electrode 262 corresponding to the cathode electrode are sequentially deposited in each pixel, and hole and electron are respectively supplied from the first electrode and the second electrode, and are then combined with each other in the organic light emitting layer so as to emit light.

The organic light emitting layer 262 is provided on the first electrode 261 and the bank 270. The organic light emitting layer 262 is a common layer provided on the pixels (RP, GP, BP, WP) in common. In this instance, the organic light emitting layer 262 may have a tandem structure of 2 stacks or more than 2 stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer obtained by doping an organic host material having an electron transporting capacity with alkali metal such as lithium (Li), sodium (Na), potassium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with a dopant.

The second electrode 263 is provided on the organic light emitting layer 262. The second electrode 263 may cover the organic light emitting layer 262. The second electrode 263 is a common layer provided on the pixels (RP, GP, BP, WP) in common.

The second electrode 263 may be formed of a transparent metal material (transparent conductive material, TCO) capable of transmitting light therethrough, for example, Indium Tin Oxide (ITO) or Indium Zinc Oxide (IZO), or may be formed of a semi-transmissive conductive material such as an alloy of magnesium (Mg) and silver (Ag). If the second electrode 263 is formed of the semi-transmissive material, it is possible to improve a light emission efficiency by a micro cavity. A capping layer may be provided on the second electrode 263.

The encapsulation layer 30 is formed on the organic light emitting device layer 260. The encapsulation layer 30 includes an encapsulation film 280.

The encapsulation film 280 is provided on the second electrode 263. The encapsulation film 280 may prevent a permeation of oxygen or moisture into the organic light emitting layer 262 and the second electrode 263. To this end, the encapsulation film 280 may include at least one inorganic film. Also, the encapsulation film 280 may include the touch sensing layer 283 for sensing a user's touch.

As shown in FIG. 5, the encapsulation film 280 may include a first inorganic film 281, an organic film 282, the touch sensing layer 283, and a second inorganic film 284.

The first inorganic film 281 may be disposed on the second electrode 263. The first inorganic film 281 may cover the second electrode 263.

The organic film 282 may be disposed on the first inorganic film 281. The organic film 282 may be formed at a thickness enough to prevent particles from getting into the organic light emitting layer 262 and the second electrode 263 through the first inorganic film 281.

The touch sensing layer 283 may be disposed on the organic film 282. The second inorganic film 284 may be disposed on the touch sensing layer 283. As shown in FIG. 6, a dam 340 is provided to prevent the organic film 282 from overflowing into a pad 330.

The touch sensing layer 283 may be disposed on the organic film 282. The touch sensing layer 283 may be provided to cover the organic film 282, and may be connected with the pad (PAD).

The second inorganic film 284 may be disposed on the touch sensing layer 283. The second inorganic film 284 may cover the touch sensing layer 283. It is possible to omit the second inorganic film 284.

Meanwhile, as shown in FIG. 6, a first touch sensing layer 283a or second touch sensing layer 283b may be connected with the pad 330. The first touch sensing layer 283a or second touch sensing layer 283b may be formed of an inorganic film by an ion implantation method, to thereby realize the encapsulation properties for preventing the permeation of moisture or oxygen. However, in order to realize the improved properties for preventing the permeation of moisture or oxygen in the pad 330, the second inorganic film 284 may be formed on the pad 330 so as to cover the first touch sensing layer 283a or second touch sensing layer 283b connected with the pad 330.

Each of the first and second inorganic films 281 and 284 may be formed of silicon nitride, aluminum nitride, zirconium nitride, titanium nitride, hafnium nitride, tantalum nitride, silicon oxide, aluminum oxide, or titanium oxide.

The touch sensing layer 283 may include the first touch electrodes (TE), the second touch electrodes (RE), the first touch sensing layer 283a including a first insulating film (INS1), and the second touch sensing layer 283 including bridge electrodes (BE) and a second insulating film (INS2).

The first touch electrodes (TE), the second touch electrodes (RE), the first touch lines (TL), the second touch lines (RL), and the first insulating film (INS1) may be disposed at the same plane (e.g., coplanar). That is, the first insulating film (INS1) is not disposed on the first touch electrodes (TE) and the second touch electrodes (RE). Therefore, an upper surface of each first touch electrode (TE), an upper surface of each second touch electrode (RE), an upper surface of each first touch line (TL), and an upper surface of each second touch line (RL), and an upper surface of the first insulating film (INS1) are flat (or continue as coplanar surfaces). The first insulating film (INS1) may be disposed between each of the first touch electrodes (TE) and each of the second touch electrodes (RE). Each of the first touch electrodes (TE) may be electrically insulated from each of the second touch electrodes (RE) by the use of the first insulating film (INS1).

Figure 15:
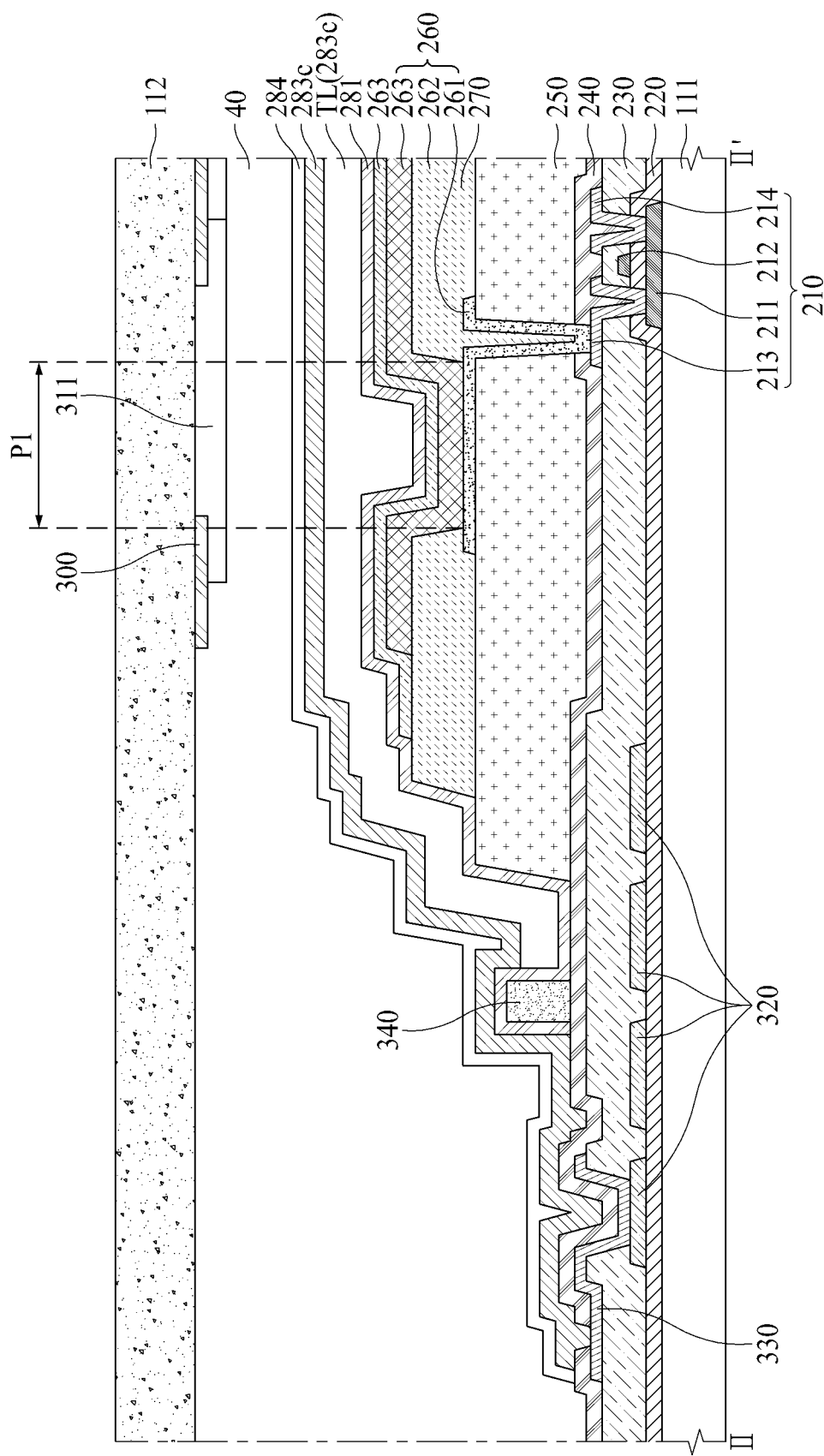
FIG. 15 is a cross sectional view illustrating another example along II-II' of FIG. 4.

The first touch line (TL) extends from the first touch electrode (TE), and the second touch line (RL) extends from the second touch electrode (RE). Each of the first and second touch lines (TL, RL) may extend to the non-display area, and may be connected with the pad 330 of the non-display area (e.g., see FIGS. 6 and 15). In FIGS. 6 and 15, portions 320 of the first or second touch line (TL or RL) are shown.

Each of the bridge electrodes (BE) may be connected with the first touch electrodes (TE) through the contact portions (CT). The bridge electrodes (BE) and the second insulating film (INS2) may be disposed at the same plane. That is, the second insulating film (INS2) is not formed on the bridge electrodes (BE), and the second insulating film (INS2) may be disposed between each of the bridge electrodes (BE). Therefore, an upper surface of each bridge electrode (BE) and an upper surface of the second insulating film (INS2) are flat. Also, the second insulating film (INS2) may be disposed between each of the second touch electrodes (RE) and between each of the bridge electrodes (BE). Each of the first touch electrodes (TE) may be electrically insulated from each of the second touch electrodes (RE) by the use of the second insulating film (INS2).

The touch sensing layer 283 may be formed by the ion implantation method to be explained later with reference to FIG. 10. In the ion implantation method, a conductive layer is changed into a non-conductive layer by the ion implantation, and the non-conductive layer is changed into the conductive layer by the ion implantation.

If forming the first and second touch sensing layers 283a and 283b by the ion implantation method, the first touch electrodes (TE), the second touch electrodes (RE), and the bridge electrodes (BE) may be formed of a metal oxide with conductivity, for example, tin oxide (TO) and indium zinc oxide (IZO). The first and second insulating films (INS1, INS2) may be formed of a metal peroxide with non-conductivity, for example, ITOX and IZOX.

Figure 7:
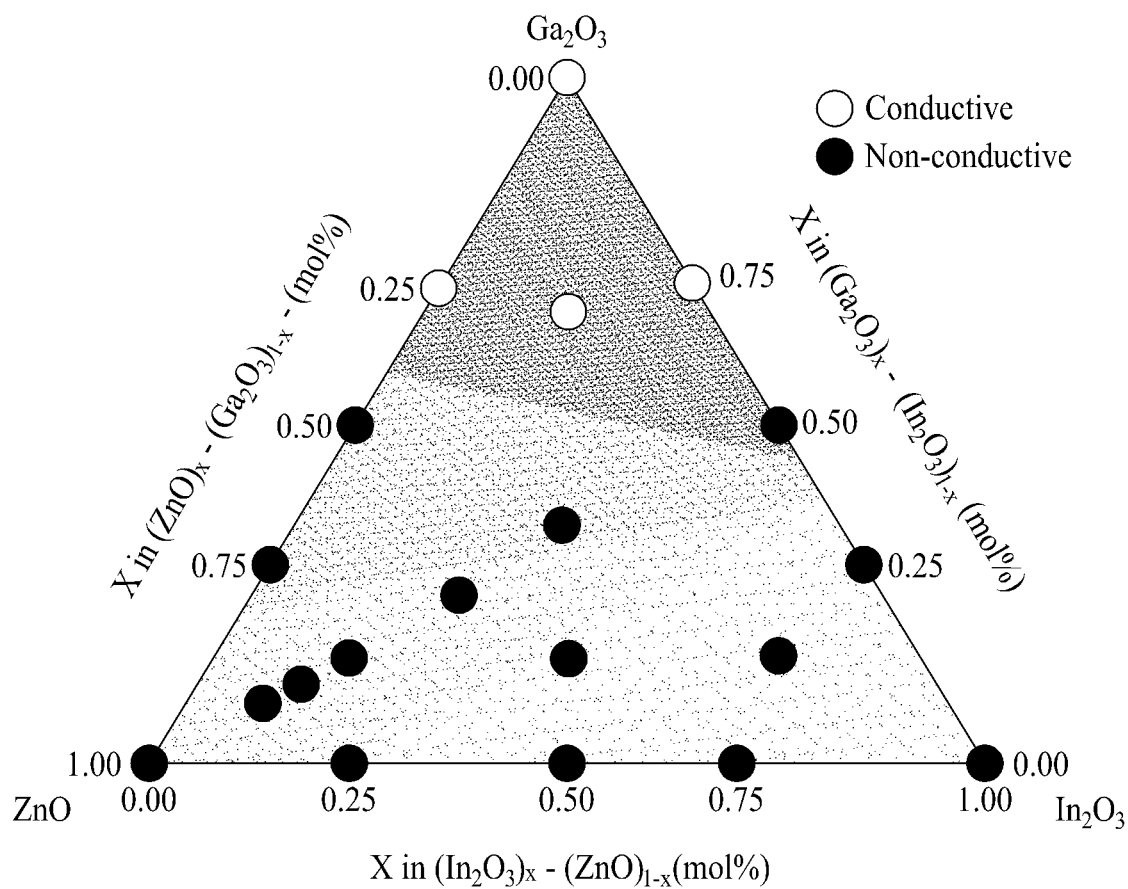
FIG. 7 illustrate the conductive and non-conductive properties in accordance with a mixing ratio of indium oxide, gallium oxide, and zinc oxide.

As shown in FIG. 7, a mixture of gallium oxide ($Ga_2O_3$) and zinc oxide (ZnO) including at least 75 mol % of gallium oxide ($Ga_2O_3$), or a mixture of gallium oxide ($Ga_2O_3$) and indium oxide ($In_2O_3$) including at least 75 mol % of gallium oxide ($Ga_2O_3$) shows the non-conductive properties. Meanwhile, a mixture of gallium oxide ($Ga_2O_3$) and zinc oxide (ZnO) including at least 25 mol % of zinc oxide (ZnO), or a mixture of gallium oxide ($Ga_2O_3$) and indium oxide ($In_2O_3$) including at least 25 mol % of indium oxide ($In_2O_3$) shows the conductive properties. Accordingly, as shown in FIG. 7, the first touch electrodes (TE), the second touch electrodes (RE), and the bridge electrodes (BE) may be formed of the zinc oxide (Zn), the indium oxide ($In_2O_3$), the mixture of gallium oxide ($Ga_2O_3$) and zinc oxide (ZnO) including at least 25 mol % of zinc oxide (ZnO), or the mixture of gallium oxide ($Ga_2O_3$) and indium oxide ($In_2O_3$) including at least 25 mol % of indium oxide ($In_2O_3$). In this instance, the first and second insulating films (INS1, INS2) may be formed of the mixture of gallium oxide ($Ga_2O_3$) and zinc oxide (ZnO) including at least 75 mol % of gallium oxide ($Ga_2O_3$), or the mixture of gallium oxide ($Ga_2O_3$) and indium oxide ($In_2O_3$) including at least 75 mol % of gallium oxide ($Ga_2O_3$).

That is, if the touch sensing layer 283 is fabricated by the ion implantation method, the touch sensing layer 283 may be formed of the inorganic film. According to the embodiment of the present invention, the touch sensing layer 283 is formed by some of the inorganic film of the encapsulation film 280 so that it is possible to minimize the increase of thickness in the display device with integrated touch screen caused by the touch sensing layer 283.

Meanwhile, the touch sensing layer 283 is formed of the inorganic film so that it is possible to prevent moisture or oxygen from being permeated into the organic light emitting layer 262 and the second electrode 263. Thus, it is possible to remove the first and second inorganic films 281 and 284 and the organic film 283 from the encapsulation film 280, that is, it is possible to provide only the touch sensing layer 283 in the encapsulation film 280.

A method for fabricating the touch sensing layer 283 by the ion implantation method will be described in detail with reference to FIG. 10.

The color filter layer 50 is formed on the encapsulation layer 40. The color filter layer 50 may include first to third color filters 311, 312, and 313, and the black matrix 300.

The first to third color filters 311, 312, and 313 are disposed on the second substrate 112, wherein a transmission wavelength range of the first to third color filters 311, 312, and 313 may be different from a transmission wavelength range of the black matrix 300. The first color filter 311 is disposed in the first pixel (P1), the second color filter 312 is disposed in the second pixel (P2), and the third color filter 313 is disposed in the third pixel (P3). The black matrix 300 may be disposed in the boundary lines of the first to third color filters 311, 312, and 313 so as to prevent light of any one pixel from being mixed with light of the adjoining pixel.

The encapsulation film 280 of the first substrate 111 may be adhered to the color filters 311, 312, and 313 of the second substrate 112 by the use of an adhesive layer 40, whereby the first and second substrates 111 and 112 may be bonded to each other. The adhesive layer 40 may be a transparent optically clear resin layer (OCR) or a transparent optically clear adhesive film (OCA).

As described above, the touch sensing layer 283 of the inorganic film may be formed in the encapsulation film 280 by the ion implantation method. As a result, the touch sensing layer 283 is formed by some area of the inorganic film of the encapsulation film 280 according to the embodiment of the present invention so that it is possible to minimize the increase of thickness in the display device with integrated touch screen caused by the touch sensing layer 283.

Figure 8:
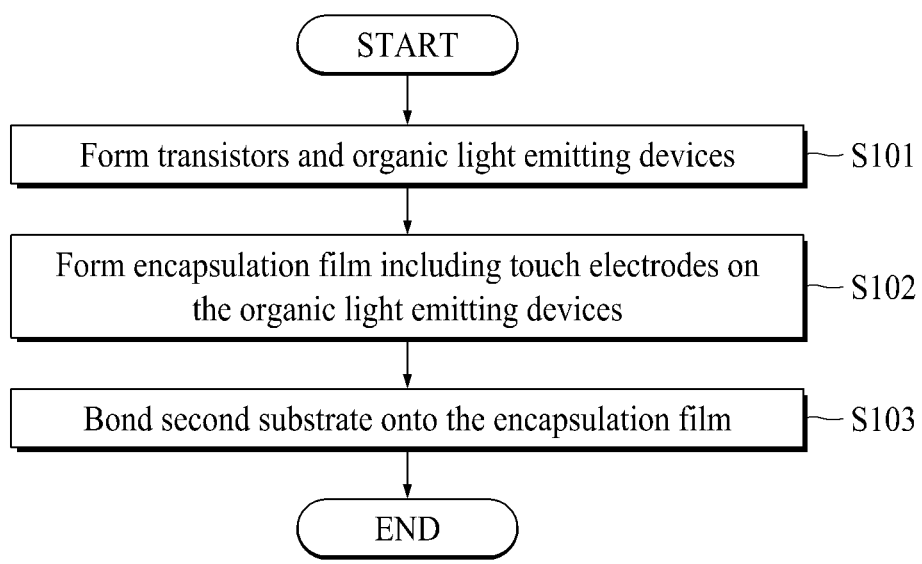
FIG. 8 is a flow chart illustrating a method for fabricating the display device with integrated touch screen according to one embodiment of the present invention.

FIG. 8 is a flow chart illustrating a method for fabricating the display device with integrated touch screen according to one embodiment of the present inventions. 9A to 9C are cross sectional views illustrating the method for fabricating the display device with integrated touch screen according to one embodiment of the present invention.

Figure 9A:
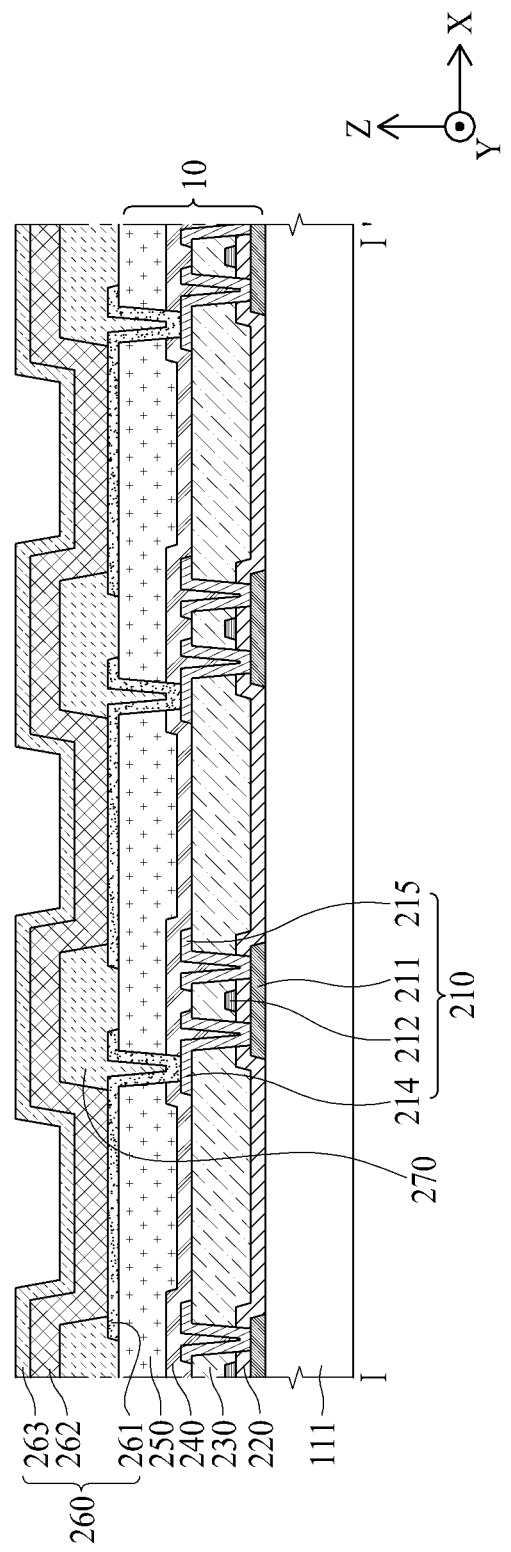
FIGS. 9A to 9C are cross sectional views illustrating the method for fabricating the display device with integrated touch screen according to one embodiment of the present invention.
Figure 9B:
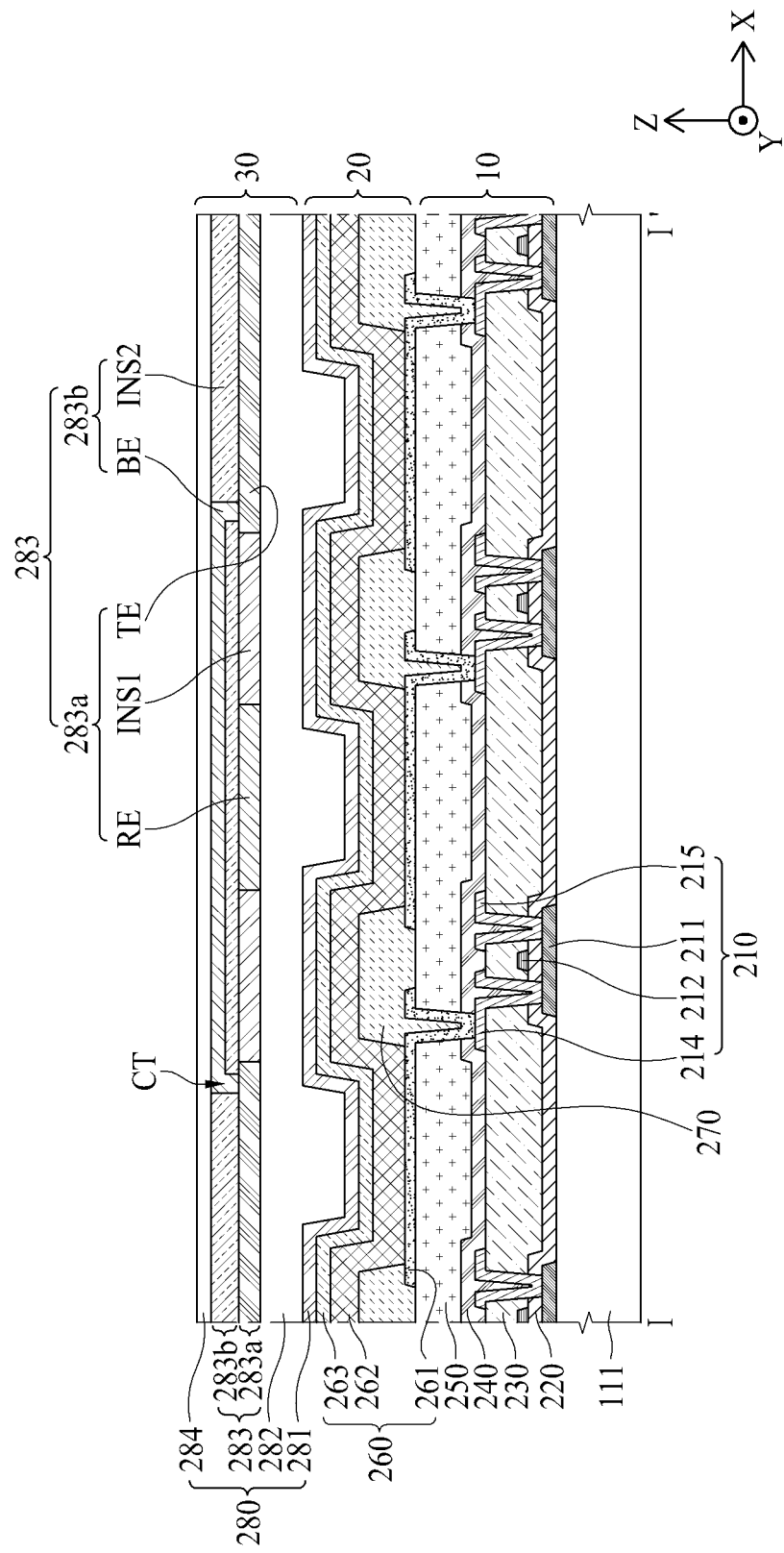
Figure 9C:
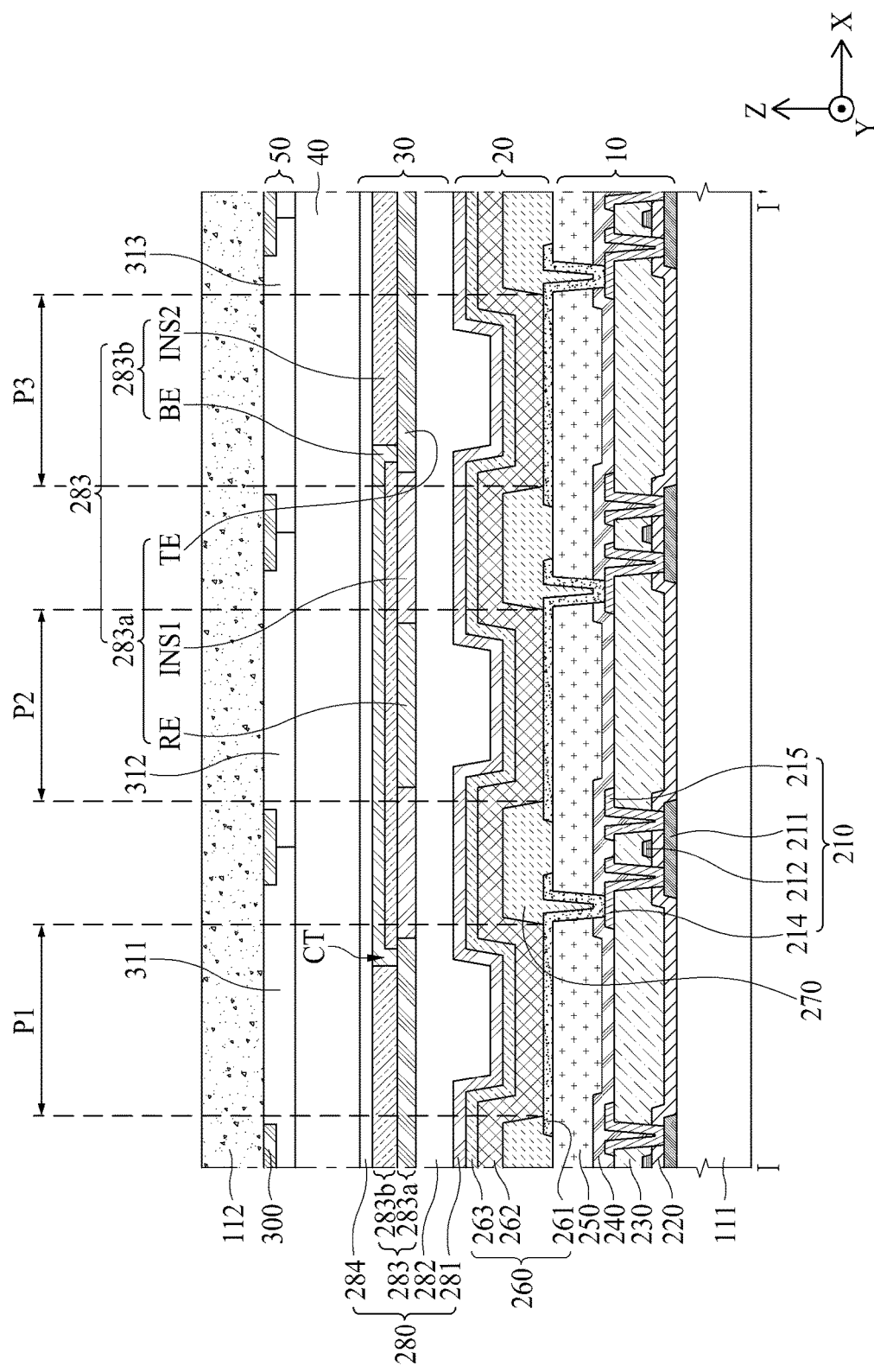

The cross sectional views shown in FIGS. 9A to 9C relate to the method for fabricating the organic light emitting display device shown in FIG. 5, whereby the same reference numbers will be used throughout the drawings to refer to the same or like parts. Hereinafter, the method for fabricating the organic light emitting display device according to one embodiment of the present invention will be described in detail with reference to FIG. 8 and FIGS. 9A to 9C.

Firstly, as shown in FIG. 9A, the thin film transistors 210 and the organic light emitting devices 260 are provided.

Before forming the thin film transistors 210, the buffer film may be formed on the first substrate 111 so as to protect the thin film transistors 210 from moisture permeating through the first substrate 111. The buffer film is provided on the first substrate 111 so as to protect the thin film transistors 210 and organic light emitting devices 260 from moisture permeating through the first substrate 111 which is vulnerable to moisture permeability. Herein, the buffer film may be formed of the plurality of inorganic films alternately deposited. For example, the buffer film may be formed in a multi-layered structure by alternately depositing at least one inorganic film from a silicon oxide film (SiOx), a silicon nitride film (SiNx), and silicon oxynitride (SiON). The buffer film may be formed by a chemical vapor deposition (CVD) method.

Then, the active layer 211 of the thin film transistor 210 is formed on the buffer film. In detail, an active metal layer is formed on an entire surface of the buffer film by sputtering or by metal organic chemical vapor deposition (MOCVD). Then, the active metal layer is patterned by a mask process using a photoresist pattern, to thereby form the active layer 211. The active layer 211 may be formed of a silicon-based or oxide-based semiconductor material.

Then, the gate insulating film 220 is formed on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 of the thin film transistor 210 may be provided on the gate insulating film 220. In detail, a first metal layer is formed on an entire surface of the gate insulating film 220 by sputtering or by metal organic chemical vapor deposition (MOCVD). Then, the first metal layer is patterned by a mask process using a photoresist pattern, to thereby form the gate electrode 212. The gate electrode 212 may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

Then, the insulating interlayer 230 may be provided on the gate electrode 212. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

Then, the contact holes for exposing the active layer 211 may be formed through the gate insulating film 220 and the insulating interlayer 230.

The source and drain electrodes 215 and 214 of the thin film transistor 210 are formed on the insulating interlayer 230. In detail, a second metal layer is formed on an entire surface of the insulating interlayer 230 by sputtering or by metal organic chemical vapor deposition (MOCVD). Then, the second metal layer is patterned by a mask process using a photoresist pattern, to thereby form the source and drain electrodes 215 and 214. Each of the source and drain electrodes 215 and 214 may be connected with the active layer 211 through the contact hole penetrating through the gate insulating film 220 and the insulating interlayer 230. The source and drain electrodes 215 and 214 may be formed in a single-layered structure or a multi-layered structure of materials selected among molybdenum (Mo), aluminum (Al), chrome (Cr), gold (Au), titanium (Ti), nickel (Ni), neodymium (Nd), copper (Cu) and their alloys.

Then, the protection film 240 is formed on the source and drain electrodes 215 and 214 of the thin film transistor 210. The protection film 240 may be formed of an inorganic film. For example, the protection film 240 may be formed in a single-layered structure of the inorganic material such as silicon oxide (SiOx) or silicon nitride (SiNx), or a multi-layered structure of the above silicon oxide (SiOx) and silicon nitride (SiNx). The protection film 240 may be formed by a chemical vapor deposition (CVD) method.

The planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

Then, the first electrode 261 of the organic light emitting device 260 may be provided on the planarization film 250. In detail, a third metal layer is formed on an entire surface of the planarization film 250 by sputtering or by metal organic chemical vapor deposition (MOCVD). Then, the third metal layer is patterned by a mask process using a photoresist pattern, to thereby form the first electrode 261. The first electrode 261 may be connected with the source electrode 215 of the thin film transistor 210 through the contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO).

The bank 270 is provided to cover the edge of the first electrode 261 on the planarization film 250, to thereby divide the pixels (P1, P2, P3). The bank 270 may be formed of an organic material, for example, acryl resin, epoxy resin, phenolic resin, polyamide resin, polyimide resin, and etc.

The organic light emitting layer 262 is formed on the first electrode 261 and the bank 270 by a deposition process or a solution process. The organic light emitting layer 262 may be a common layer provided on the pixels (P1, P2, P3) in common. In this instance, the organic light emitting layer 262 may be a white light emitting layer for emitting white light.

If the organic light emitting layer 262 is the white light emitting layer, it may have a tandem structure of 2 stacks or more than 2 stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer obtained by doping an organic host material having an electron transporting capacity with alkali metal such as lithium (Li), sodium (Na), potassium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with a dopant.

The second electrode 263 is provided on the organic light emitting layer 262. The second electrode 263 may be a common layer provided on the pixels (P1, P2, P3) in common. The second electrode 263 may be formed of a transparent metal material (transparent conductive material, TCO) capable of transmitting light therethrough, for example, Indium Tin Oxide (ITO) or Indium Zinc Oxide (IZO). The second electrode 263 may be formed by sputtering or physical vapor deposition (PVD) method. The capping layer may be formed on the second electrode 263 (See 'S101' of FIG. 8).

Secondly, as shown in FIG. 9B, the encapsulation film 280 including the touch sensing layer 283 is formed on the organic light emitting devices 260.

A method for forming the encapsulation film 280 including the touch sensing layer 283 by the ion implantation method may be classified into a method for forming the first touch sensing layer 283a by making the non-conductive layer be conductive, and a method for forming the first touch sensing layer 283a by making the conductive layer be non-conductive. The method for forming the first touch sensing layer 283a by making the non-conductive layer be conductive will be described in detail with reference to FIG. 10 and FIGS. 11A to 11G. The method for forming the encapsulation film 280 through the use of a method for forming the first touch sensing layer 283a by making the conductive layer be non-conductive will be described in detail with reference to FIG. 12 and FIGS. 13A and 13B (See 'S102' of FIG. 8).

Thirdly, as shown in FIG. 9C, the second substrate 112 is bonded to the encapsulation film 280.

In detail, the encapsulation film 280 of the first substrate 111 is adhered to the color filters 311, 312, and 313 of the second substrate 112 by the use of an adhesive layer 40 so that it is possible to bond the first and second substrates 111 and 112 to each other. The adhesive layer 40 may be a transparent optically clear resin layer (OCR) or a transparent optically clear adhesive film (OCA) (See 'S103' of FIG. 8).

Figure 10:
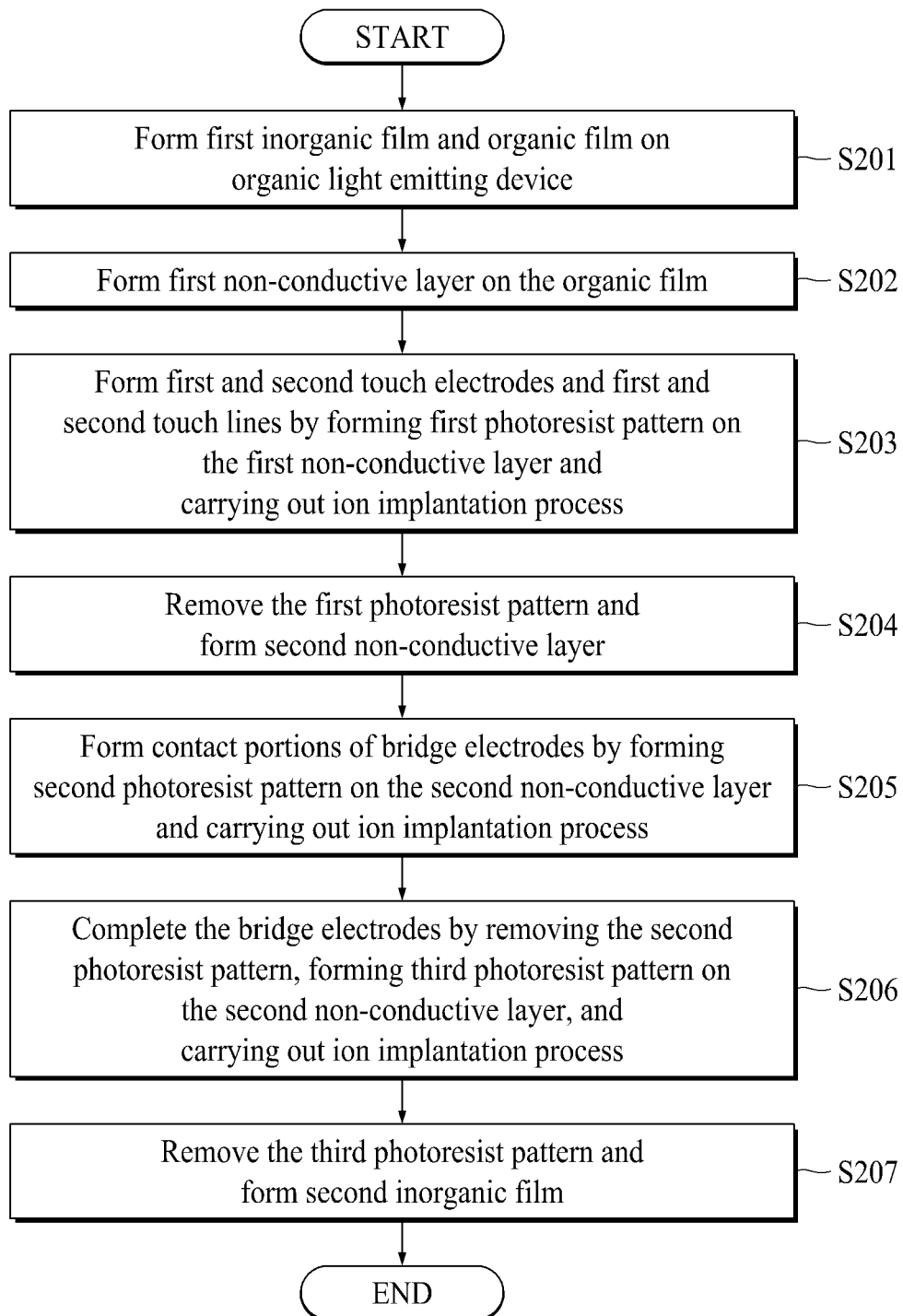
FIG. 10 is a flow chart illustrating one example of operation S102 of FIG. 8.

FIG. 10 is a flow chart illustrating one example of operation S102 of FIG. 8. FIGS. 11A to 11G are cross sectional views illustrating one example of operation S102.

The cross sectional views shown in FIGS. 11A to 11G relate to the method for fabricating the organic light emitting display device shown in FIG. 5, whereby the same reference numbers will be used throughout the drawings to refer to the same or like parts. Hereinafter, the method (step S102) for forming the encapsulation film 280 including the touch sensing layer 283 will be described in detail with reference to FIG. 10 and FIGS. 11A to 11G.

Figure 11A:
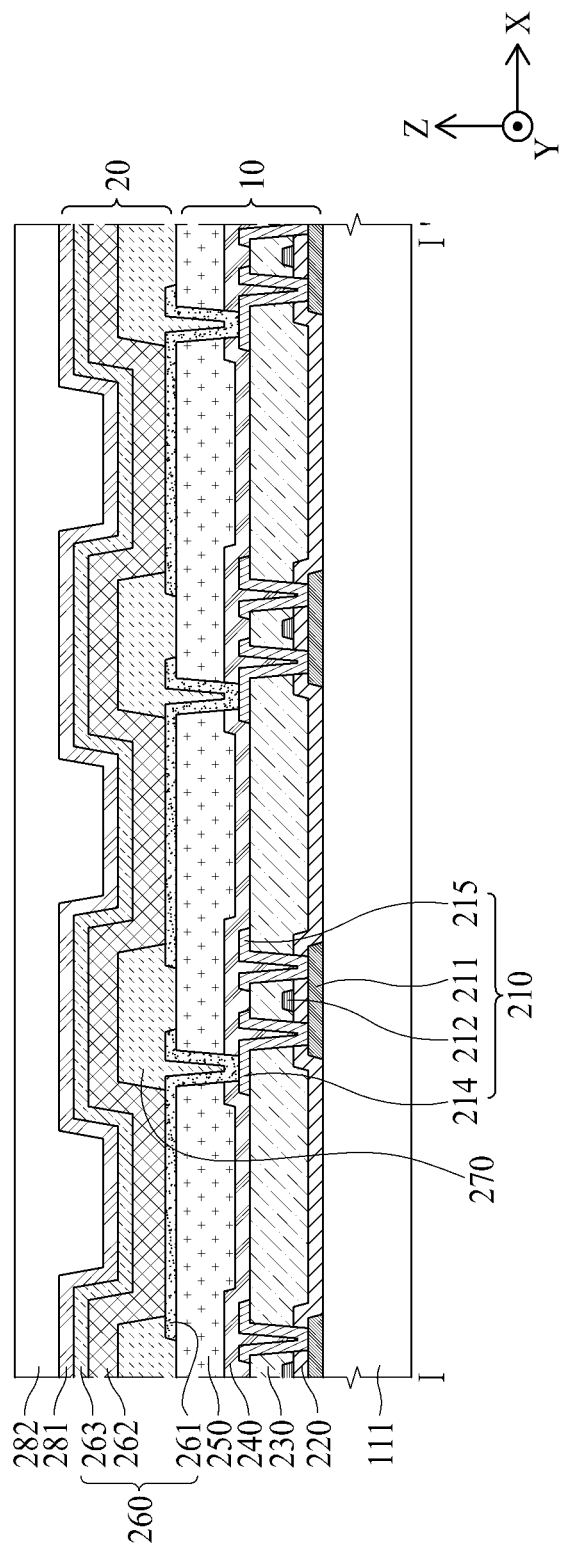

Firstly, as shown in FIG. 11A, the first inorganic film 281 and the organic film 282 are formed on the second electrode 263.

The first inorganic film 281 prevents moisture or oxygen from being permeated into the organic light emitting layer 262 and the second electrode 263. The first inorganic film 281 may cover the second electrode 263. The first inorganic film 281 may be formed of silicon nitride, aluminum nitride, zirconium nitride, titanium nitride, hafnium nitride, tantalum nitride, silicon oxide, aluminum oxide, or titanium oxide.

The organic film 282 is formed on the first inorganic film 281. The organic film 282 may be blocked by the dam 340 so that it is possible to prevent the pad 330 from being covered by the organic film 282, as shown in FIG. 6. The organic film 282 may be formed at a thickness enough to prevent particles from getting into the organic light emitting layer 262 and the second electrode 263 through the encapsulation film 280 (See 'S201' of FIG. 10).

Figure 11B:
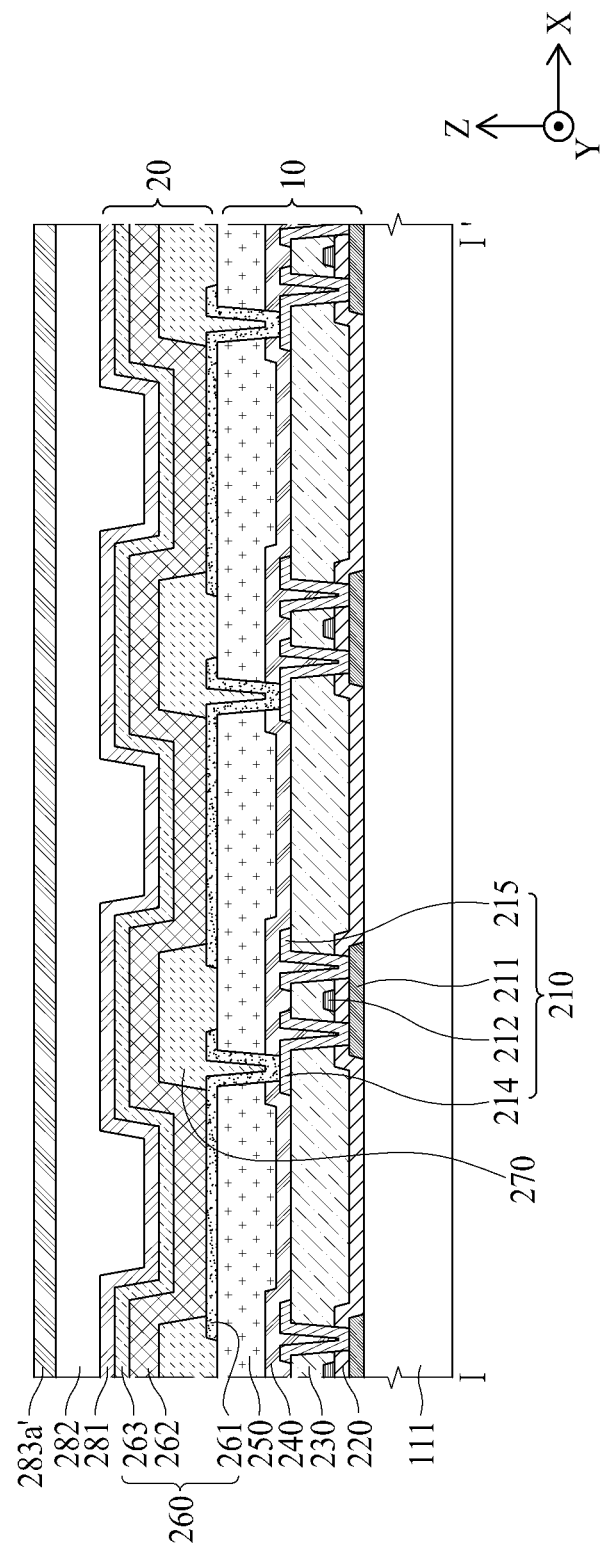

Secondly, as shown in FIG. 11B, a first non-conductive layer 283a' is formed on the organic film 282. The first non-conductive layer 283a' may be formed of a metal peroxide with non-conductivity, for example, ITOX and IZOX, or may be formed of gallium oxide ($Ga_2O_3$), a mixture of gallium oxide ($Ga_2O_3$) and zinc oxide (ZnO) including at least 75 mol % of gallium oxide ($Ga_2O_3$), or a mixture of gallium oxide ($Ga_2O_3$) and indium oxide ($In_2O_3$) including at least 75 mol % of gallium oxide ($Ga_2O_3$) (See 'S202' of FIG. 10).

Thirdly, as shown in FIG. 11C, a first photoresist pattern (PR1) is formed on the first non-conductive layer 283a', and then an ion implantation process is carried out. In this instance, a predetermined portion of the first non-conductive layer 283a', which is exposed without being covered by the first photoresist pattern (PR1), becomes a conductor. For example, if the first non-conductive layer 283a' is formed of a metal peroxide with non-conductivity, for example, ITOX and IZOX, the first non-conductive layer 283a' may be a conductor by a hydrogen ion (H+) implantation process. Also, if the first non-conductive layer 283a' is formed of the gallium oxide ($Ga_2O_3$), or the mixture of gallium oxide ($Ga_2O_3$) and zinc oxide (ZnO) including at least 75 mol % of gallium oxide ($Ga_2O_3$), it may be changed to the mixture of gallium oxide ($Ga_2O_3$) and zinc oxide (ZnO) including at least 25 mol % of zinc oxide (ZnO) by a zinc ion ($Zn^{2+}$) implantation process, which becomes a conductor. Also, if the first non-conductive layer 283a' is formed of the gallium oxide ($Ga_2O_3$), or the mixture of gallium oxide ($Ga_2O_3$) and indium oxide ($In_2O_3$) including at least 75 mol % of gallium oxide ($Ga_2O_3$), it may be changed to the mixture of gallium oxide ($Ga_2O_3$) and indium oxide ($In_2O_3$) including at least 25 mol % of indium oxide ($In_2O_3$) by an indium ion ($In^{3+}$) implantation process, which becomes a conductor.

As a result, the predetermined portion of the first non-conductive layer 283a', which is exposed without being covered by the first photoresist pattern (PR1), corresponds to the first and second touch electrodes (TE, RE) and the first and second touch lines (TL, RL), which may be a conductor. According to the first non-conductive layer 283a', which is covered by the first photoresist pattern (PR1), having the non-conductive properties, it serves as the first insulating film (INS1). Accordingly, it is possible to form the first touch sensing layer 283a with the first and second touch electrodes (TE, RE), the first and second touch lines (TL, RL), and the first insulating film (INS1) formed at the same plane (See 'S203' of FIG. 10).

Figure 11D:
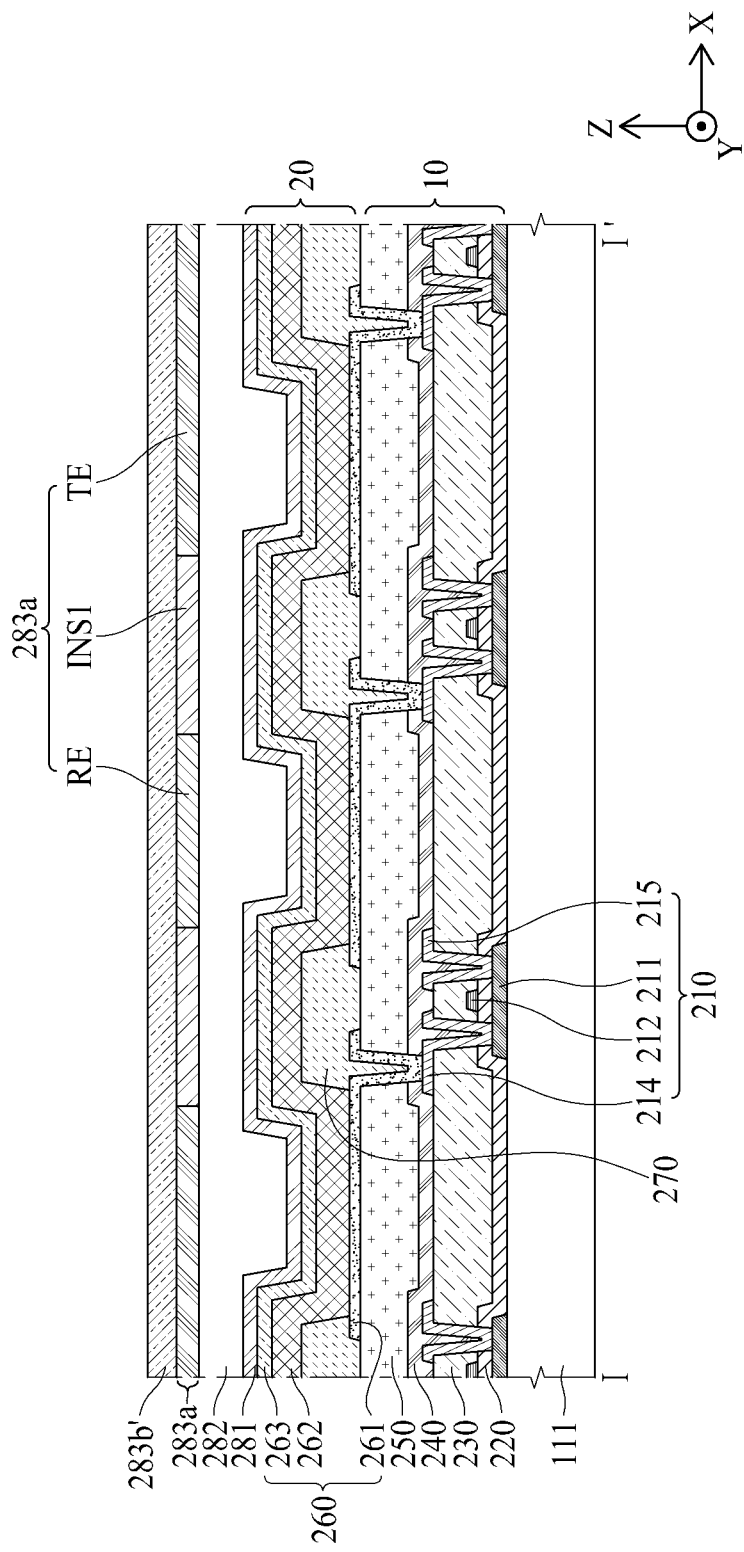

Fourthly, as shown in FIG. 11D, the first photoresist pattern (PR1) is removed, and a second non-conductive layer 283b' is formed on the first touch sensing layer 283a.

The second non-conductive layer 283b' may be formed of a metal peroxide with non-conductivity, for example, ITOX and IZOX, or may be formed of gallium oxide ($Ga_2O_3$), a mixture of gallium oxide ($Ga_2O_3$) and zinc oxide (ZnO) including at least 75 mol % of gallium oxide ($Ga_2O_3$), or a mixture of gallium oxide ($Ga_2O_3$) and indium oxide ($In_2O_3$) including at least 75 mol % of gallium oxide ($Ga_2O_3$) (See 'S204' of FIG. 10).

Figure 11E:
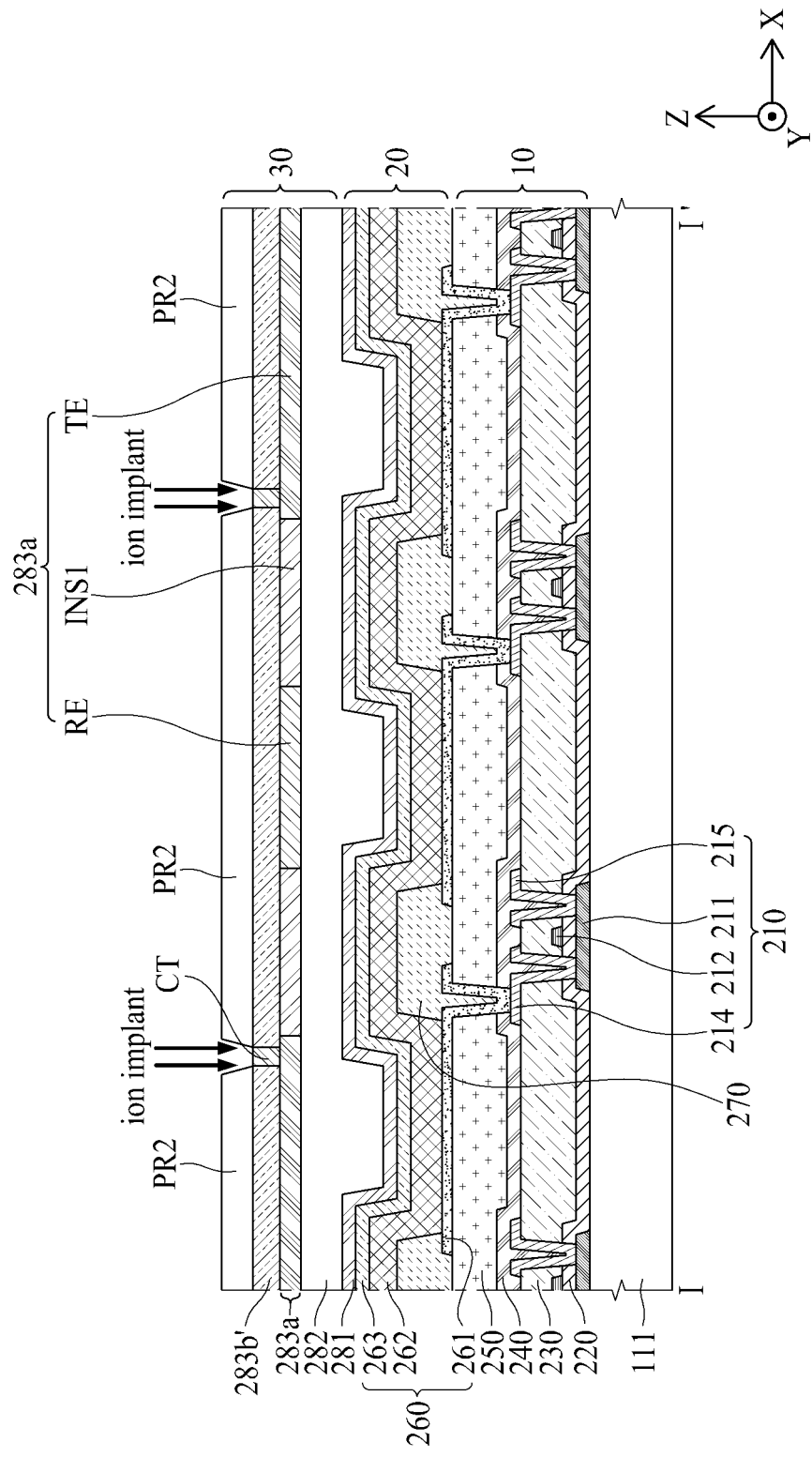

Fifthly, as shown in FIG. 11E, a second photoresist pattern (PR2) is formed on the second non-conductive layer 283b', and then an ion implantation process is carried out. In this instance, a predetermined portion of the second non-conductive layer 283b', which is exposed without being covered by the second photoresist pattern (PR2), becomes a conductor. For example, if the second non-conductive layer 283b' is formed of a metal peroxide with non-conductivity, for example, ITOX and IZOX, the second non-conductive layer 283b' may be a conductor by a hydrogen ion (H+) implantation process. Also, if the second non-conductive layer 283b' is formed of the gallium oxide ($Ga_2O_3$), or the mixture of gallium oxide ($Ga_2O_3$) and zinc oxide (ZnO) including at least 75 mol % of gallium oxide ($Ga_2O_3$), it may be changed to the mixture of gallium oxide ($Ga_2O_3$) and zinc oxide (ZnO) including at least 25 mol % of zinc oxide (ZnO) by a zinc ion ($Zn^{2+}$) implantation process, which becomes a conductor. Also, if the second non-conductive layer 283b' is formed of the gallium oxide ($Ga_2O_3$), or the mixture of gallium oxide ($Ga_2O_3$) and indium oxide ($In_2O_3$) including at least 75 mol % of gallium oxide ($Ga_2O_3$), it may be changed to the mixture of gallium oxide ($Ga_2O_3$) and indium oxide ($In_2O_3$) including at least 25 mol % of indium oxide ($In_2O_3$) by an indium ion ($In^{3+}$) implantation process, which becomes a conductor.

As a result, the predetermined portion of the second non-conductive layer 283b', which is exposed without being covered by the second photoresist pattern (PR2), corresponds to the contact portions (CT) of the bridge electrodes (BE), which may be a conductor. The second non-conductive layer 283b' which is covered by the second photoresist pattern (PR2) has the non-conductive properties (See 'S205' of FIG. 10).

Figure 11F:
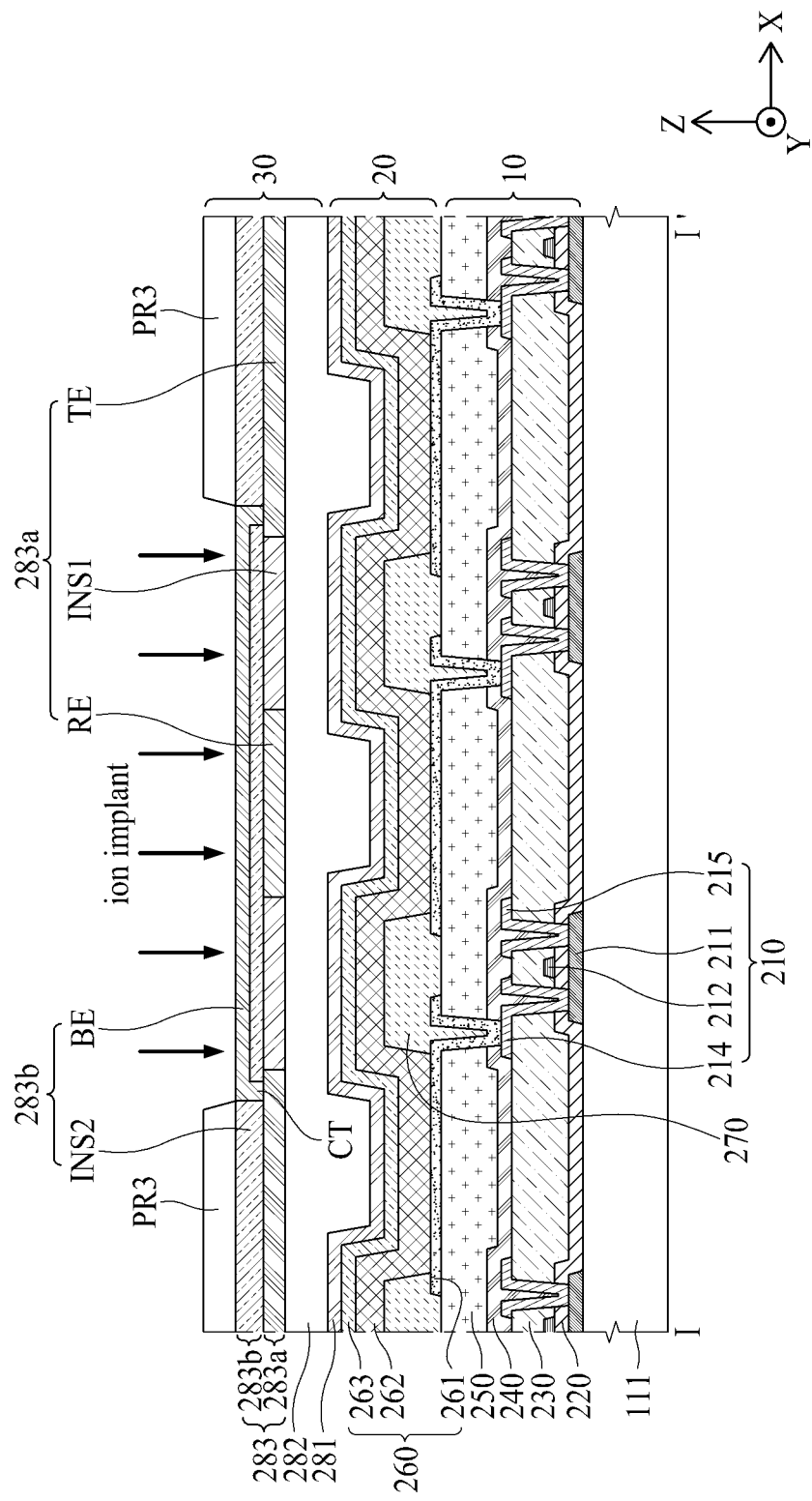

Sixthly, as shown in FIG. 11F, the second photoresist pattern (PR2) is removed. Then, a third photoresist pattern (PR3) is formed on the second non-conductive layer 283b' with the contact portions (CT) of the bridge electrodes (BE), and then an ion implantation process is carried out thereto. In this instance, the second non-conductive layer 283b', which is exposed without being covered by the third photoresist pattern (PR3), becomes a conductor. Herein, the ion implantation process is carried out in such a way that an upper surface of the second non-conductive layer 283b', which is exposed without being covered by the third photoresist pattern (PR3), becomes a conductor, and a lower surface of the second non-conductive layer 283b' does not become a conductor. In adjusting an amount of ion implantation, and an energy of ion implantation for the ion implantation process, only the upper surface of the second non-conductive layer 283b' becomes a conductor, and the lower surface of the second non-conductive layer 283b' does not become a conductor.

As a result, the upper surface of the second non-conductive layer 283b' which is exposed without being covered by the third photoresist pattern (PR3) becomes a conductor so that it is possible to complete the bridge electrodes (BE). The second non-conductive layer 283b' which is covered by the third photoresist pattern (PR3) has the non-conductive properties so that the second non-conductive layer 283b' which is covered by the third photoresist pattern (PR3) serves as the second insulating film (INS2). Accordingly, it is possible to form the second touch sensing layer 283b with the bridge electrodes (BE) and the second insulating film (INS2) formed at the same plane (See 'S206' of FIG. 10).

Seventhly, the third photoresist pattern (PR3) is removed, and the second inorganic film 284 is formed on the second touch sensing layer 283b.

The second inorganic film 284 prevents moisture or oxygen from being permeated into the organic light emitting layer 262 and the second electrode 263. The second inorganic film 284 may cover the touch sensing layer 283. The second inorganic film 284 may be formed of silicon nitride, aluminum nitride, zirconium nitride, titanium nitride, hafnium nitride, tantalum nitride, silicon oxide, aluminum oxide, or titanium oxide (See 'S207' of FIG. 10).

As described above, the first non-conductive layer 283a' is formed, and then some of the first non-conductive layer 283a' selectively becomes a conductor by the ion implantation process, whereby it is possible to provide the first touch sensing layer 283a with the first and second touch electrodes (TE, RE), the first and second touch lines (TL, RL), and the first insulating film (INS1) formed at the same plane. Also, the second non-conductive layer 283b' is formed, and then some of the second non-conductive layer 283b' selectively becomes a conductor by the ion implantation process, whereby it is possible to provide the second touch sensing layer 283b with the bridge electrodes (BE) and the second insulating film (INS2) formed at the same plane. That is, it is possible to form the touch sensing layer 283 with the inorganic film in the encapsulation film 280 by the ion implantation process. As a result, the touch sensing layer 283 may be formed of some area of the inorganic film included in the encapsulation film 280 according to the embodiment of the present invention, so that it is possible to minimize the increase of thickness in the display device with integrated touch screen caused by the touch sensing layer 283.

Figure 12:
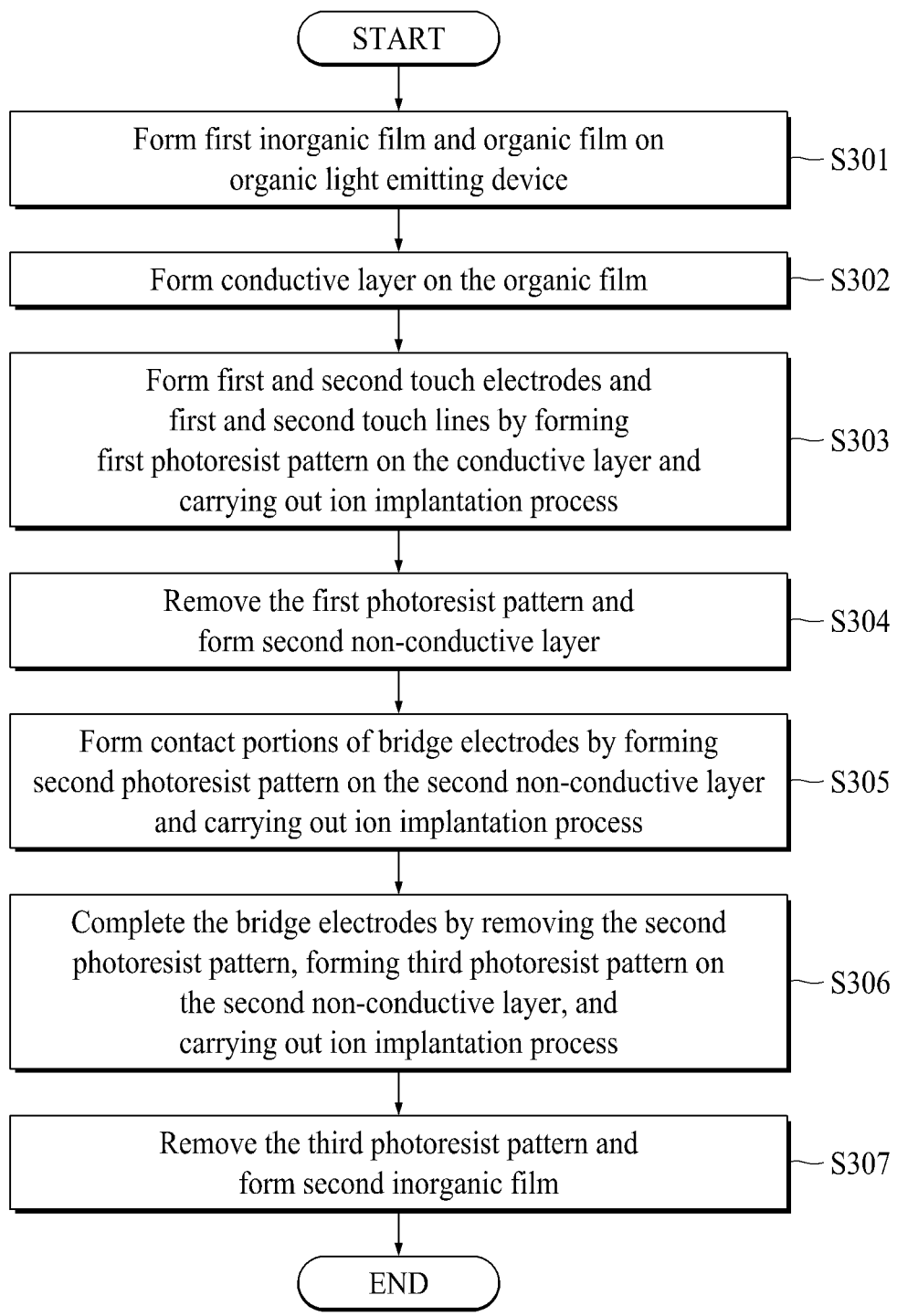
FIG. 12 is a flow chart illustrating another example of operation S102 of FIG. 8.
Figure 13A:
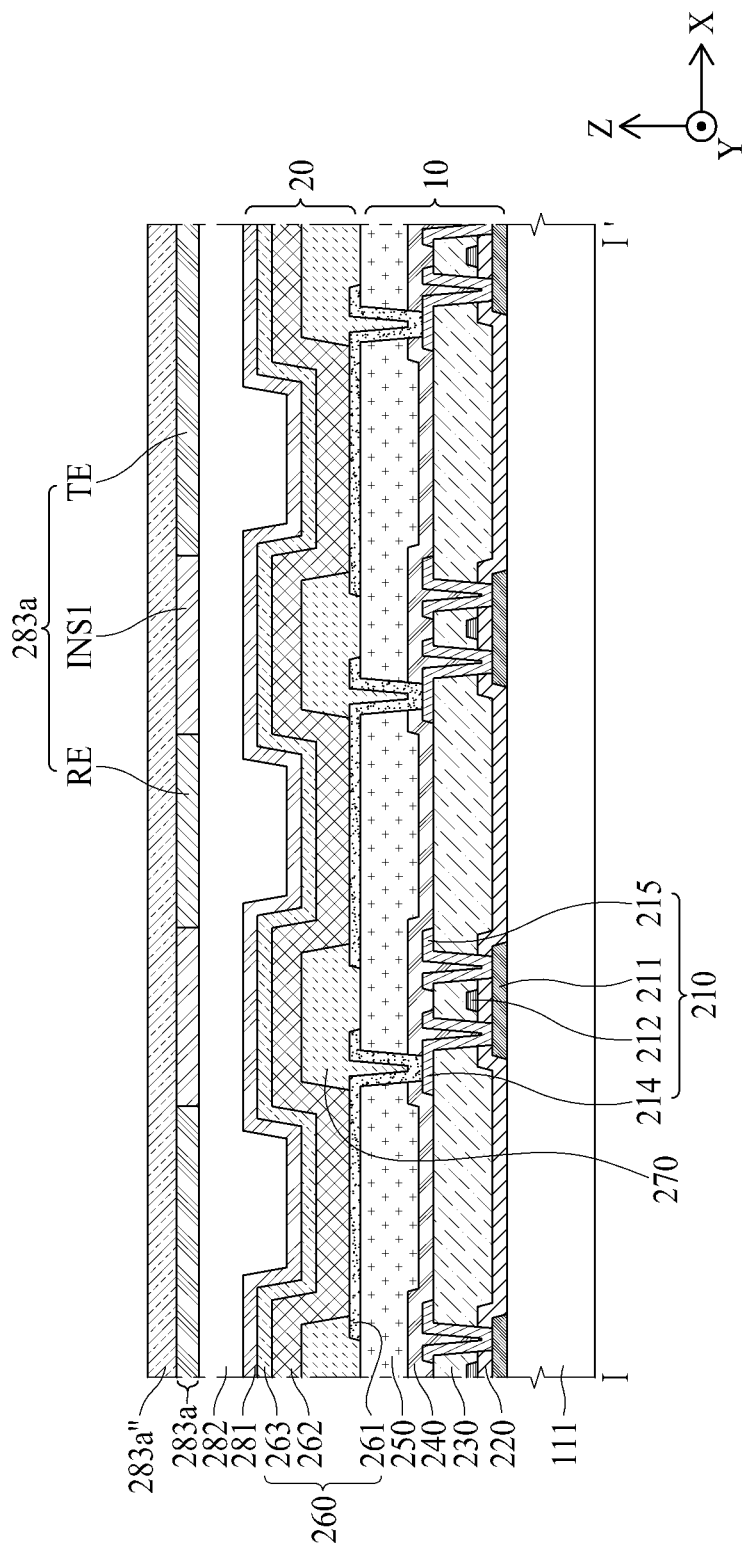
FIGS. 13A and 13B are cross sectional views illustrating another example of operation S102.
Figure 13B:
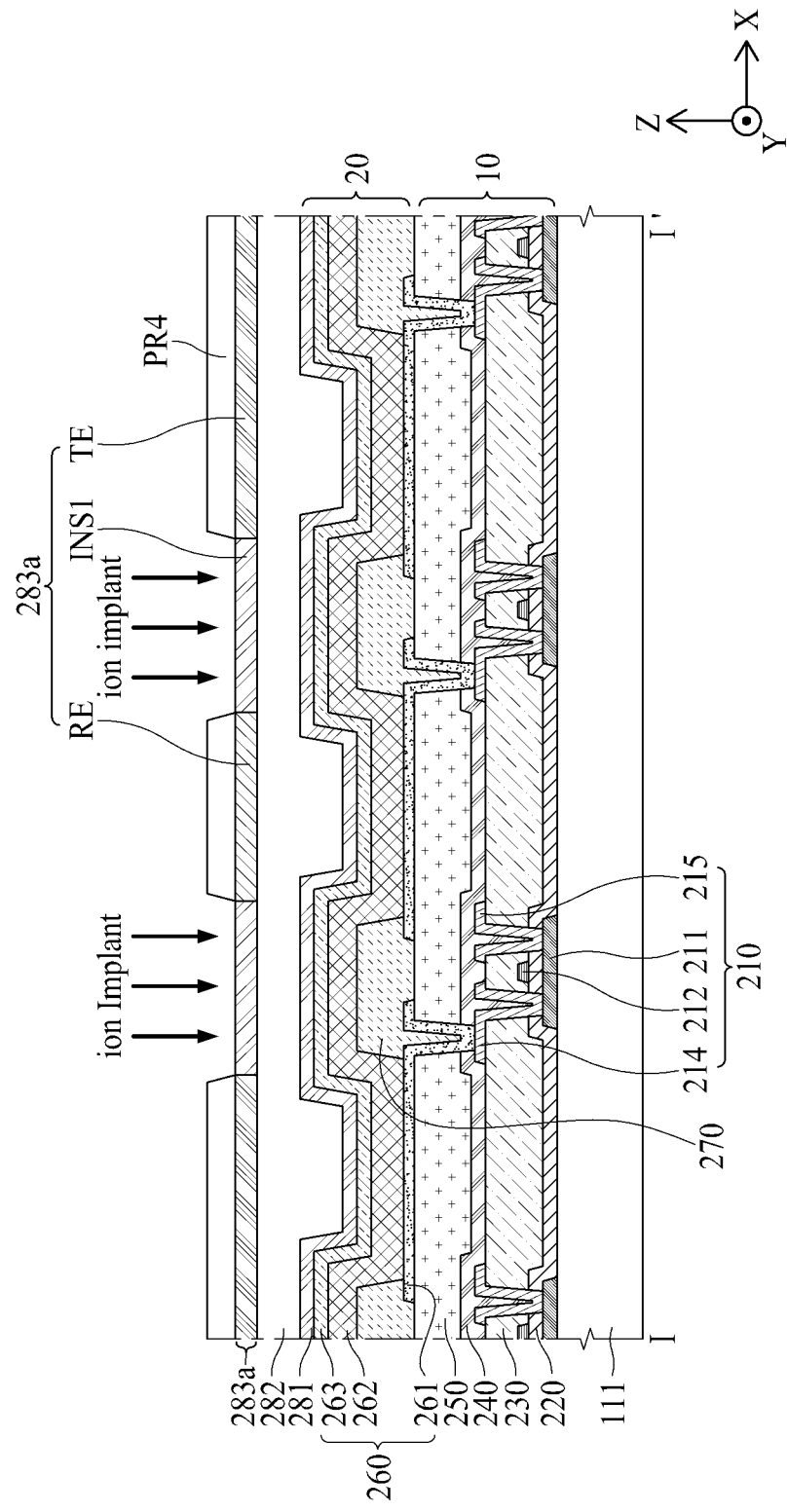

FIG. 12 is a flow chart illustrating another example of operation S102 of FIG. 8. FIGS. 13A and 13B are cross sectional views illustrating another example of operation S102.

The cross sectional views shown in FIGS. 13A and 13B relate to the method for fabricating the organic light emitting display device shown in FIG. 5, whereby the same reference numbers will be used throughout the drawings to refer to the same or like parts. Hereinafter, the method (step S102) for forming the encapsulation film 280 including the touch sensing layer 283 will be described in detail with reference to FIG. 12 and FIGS. 13A and 13B.

Meanwhile, operation S301 and operations S304 to S307 of FIG. 12 are the same as operation S201 and operations S204 to S207 of FIG. 10, whereby a detailed description for operation S301 and operations S304 to S307 of FIG. 12 will be omitted.

Referring to FIG. 13A, a conductive layer 283a" is formed on the organic film 282. The conductive layer 283a" may be formed of a metal oxide with the conductive properties, for example, ITO and IZO, or may be formed of a mixture of gallium oxide ($Ga_2O_3$) and zinc oxide (ZnO) including at least 25 mol % of zinc oxide (ZnO), or a mixture of gallium oxide ($Ga_2O_3$) and indium oxide ($In_2O_3$) including at least 25 mol % of indium oxide ($In_2O_3$) (See 'S302' of FIG. 12).

As shown in FIG. 13B, a fourth photoresist pattern (PR4) is formed on the conductive layer 283a", and an ion implantation process is carried out thereto. In this instance, a predetermined portion of the conductive layer 283a", which is exposed without being covered by the fourth photoresist pattern (PR4), becomes a non-conductor (or an insulator). For example, if the conductive layer 283a" is formed of the metal oxide with the conductive properties, for example, ITO and IZO, the conductive layer 283a" becomes a non-conductor by an oxygen ion ($O^{2-}$) implantation process. Also, if the conductive layer 283a" is formed of the mixture of gallium oxide ($Ga_2O_3$) and zinc oxide (ZnO) including at least 25 mol % of zinc oxide (ZnO), it is changed to the mixture of gallium oxide ($Ga_2O_3$) and zinc oxide (ZnO) including at least 25 mol % of gallium oxide ($Ga_2O_3$) by a gallium ion ($Ga^{3+}$) implantation, which becomes a non-conductor. Also, if the conductive layer 283a" is formed of the mixture of gallium oxide ($Ga_2O_3$) and indium oxide ($In_2O_3$) including at least 25 mol % of indium oxide ($In_2O_3$), it is changed to the mixture of gallium oxide ($Ga_2O_3$) and indium oxide ($In_2O_3$) including at least 25 mol % of gallium oxide ($Ga_2O_3$), which becomes a non-conductor.

As a result, the conductive layer 283a" covered by the fourth photoresist pattern (PR4) has the conductive properties so that the conductive layer 283a" covered by the fourth photoresist pattern (PR4) serves as the first and second touch electrodes (TE, RE) and the first and second touch lines (TL, RL). Also, the conductive layer 283a" which is not covered by the fourth photoresist pattern (PR4) becomes a non-conductor so that the conductive layer 283a" which is not covered by the fourth photoresist pattern (PR4) serves as the first insulating film (INS1). Accordingly, it is possible to form the first touch sensing layer 283a with the first and second touch electrodes (TE, RE), the first and second touch lines (TL, RL), and the first insulating film (INS1) formed at the same plane (See 'S303' of FIG. 12).

As described above, the conductive layer 283a" is formed, and then some of the conductive layer 283a" selectively becomes a non-conductor by the ion implantation process, whereby it is possible to provide the first touch sensing layer 283a with the first and second touch electrodes (TE, RE), the first and second touch lines (TL, RL), and the first insulating film (INS1) formed at the same plane. Also, the non-conductive layer 283b' is formed, and then some of the non-conductive layer 283b' selectively becomes a conductor by the ion implantation process, whereby it is possible to provide the second touch sensing layer 283b with the bridge electrodes (BE) and the second insulating film (INS2) formed at the same plane. That is, it is possible to form the touch sensing layer 283 with the inorganic film in the encapsulation film 280 by the ion implantation process. As a result, the touch sensing layer 283 may be formed of some area of the inorganic film included in the encapsulation film 280 according to the embodiment of the present invention, so that it is possible to minimize the increase of thickness in the display device with integrated touch screen caused by the touch sensing layer 283.

Figure 14:
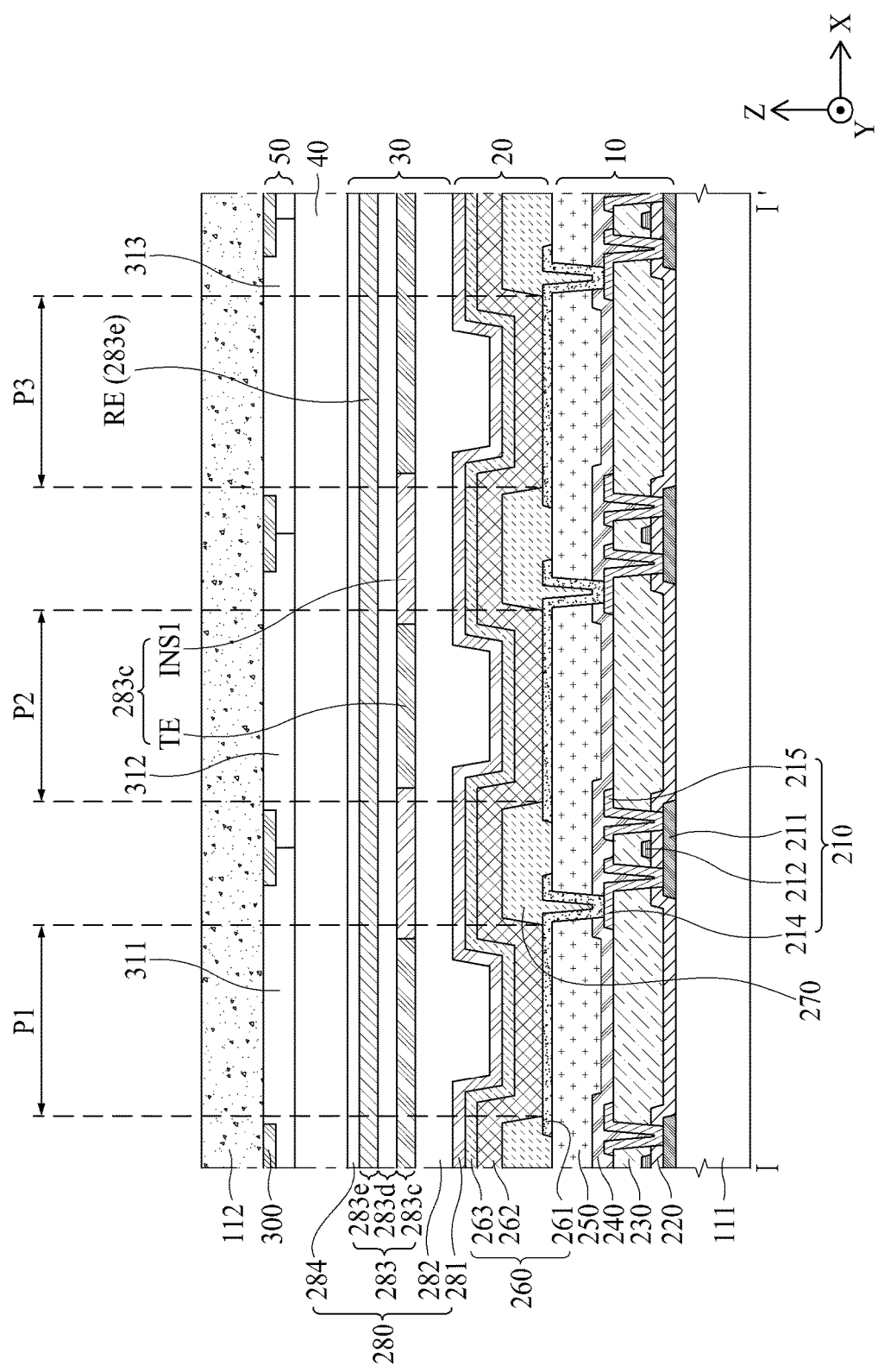
FIG. 14 is a cross sectional view illustrating another example along I-I' of FIG. 4.

FIG. 14 is a cross sectional view illustrating another example along I-I' of FIG. 4. FIG. 15 is a cross sectional view illustrating another example along II-II' of FIG. 4.

Except a touch sensing layer 283 includes a first touch sensing layer 283c, an insulating film 283d, and a second touch sensing layer 283e, the cross sectional views shown in FIGS. 14 and 15 are the same as those of FIGS. 5 and 6. Accordingly, a detailed description for a first substrate 111, a second substrate 112, a thin film transistor layer 10, an organic light emitting device layer 20, an adhesive layer 40, and a color filter layer 50 shown in FIGS. 14 and 15 will be omitted.

Referring to FIGS. 14 and 15, an encapsulation film 280 may include a first inorganic film 281, an organic film 282, a touch sensing layer 283, and a second inorganic film 284.

The first inorganic film 281, the organic film 282, and the second inorganic film 284 are the same as those of FIGS. 5 and 6, whereby a detailed description for the first inorganic film 281, the organic film 282, and the second inorganic film 284 will be omitted.

The touch sensing layer 283 may be disposed on the organic film 282. The touch sensing layer 283 may cover the organic film 282, and may be connected with a pad (PAD).

The touch sensing layer 283 may include the first touch sensing layer 283c, the insulating film 283d, and the second touch sensing layer 283e.

The first touch sensing layer 283c may include first touch electrodes (TE), first touch lines (TL), and a first insulating film (INS1). The first touch electrodes (TE), the first touch lines (TL), and the first insulating film (INS1) are formed in the first touch sensing layer 283c, whereby the first touch electrodes (TE), the first touch lines (TL), and the first insulating film (INS1) are disposed at the same plane. That is, the first insulating film (INS1) is not disposed on the first touch electrodes (TE), and the first insulating film (INS1) may be disposed between each of the first touch electrodes (TE). Therefore, an upper surface of each first touch electrode (TE), an upper surface of each first touch line (TL), and an upper surface of the first insulating film (INS1) are flat. Each of the first touch electrodes (TE) may be insulated from each other by the use of the first insulating film (INS1).

The first touch line (TL) may extend from the first touch electrode (TE). Each of the first touch lines (TL) may extend to a non-display area, and may be connected with the pad of the non-display area.

The second touch sensing layer 283e may include second touch electrodes (RE), second touch lines (RL), and a second insulating film (INS2). The second touch electrodes (RE), the second touch lines (RL), and the second insulating film (INS2) are formed in the second touch sensing layer 283e, whereby the second touch electrodes (RE), the second touch lines (RL), and the second insulating film (INS2) are disposed at the same plane. Therefore, an upper surface of each second touch electrode (RE), an upper surface of each second touch line (RL), and an upper surface of the second insulating film (INS2) are flat. That is, the second insulating film (INS2) is not disposed on the second touch electrodes (RE), and the second insulating film (INS2) may be disposed between each of the second touch electrodes (RE). Each of the second touch electrodes (RE) may be insulated from each other by the use of the second insulating film (INS2).

In order to electrically insulate the first touch sensing layer 283c and the second touch sensing layer 283e from each other, the insulating film 283d may be disposed between the first touch sensing layer 283c and the second touch sensing layer 283e. The insulating film 283d may be formed of an inorganic film, for example, silicon nitride, aluminum nitride, zirconium nitride, titanium nitride, hafnium nitride, tantalum nitride, silicon oxide, aluminum oxide, or titanium oxide.

In FIG. 14, the first touch electrodes (TE) and the second touch electrodes (RE) of the touch sensing layer 283 may be insulated from each other by the use of insulating film 283d. Thus, there is no need for an additional bridge electrode (BE) for the connection of the first touch electrodes (TE) or second touch electrodes (RE) at the intersections of the first and second touch electrodes (TE, RE).

The touch sensing layer 283 may be formed by an ion implantation process. By the ion implantation process, a conductive layer is changed to a non-conductive layer, or the non-conductive layer is changed to the conductive layer.

If the first and second touch sensing layers 283c and 283e are formed by the ion implantation process, the first and second touch electrodes (TE, RE), and the first and second touch lines (TL, RL) may be formed of a metal oxide with the conductive properties, for example, ITO and IZO, and the first and second insulating films (INS1, INS2) may be formed of a metal peroxide with the non-conductive properties, for example, ITOX and IZOX.

As shown in FIG. 7, a mixture of gallium oxide ($Ga_2O_3$) and zinc oxide (ZnO) including at least 75 mol % of gallium oxide ($Ga_2O_3$), or a mixture of gallium oxide ($Ga_2O_3$) and indium oxide ($In_2O_3$) including at least 75 mol % of gallium oxide ($Ga_2O_3$) shows the non-conductive properties. Meanwhile, a mixture of gallium oxide ($Ga_2O_3$) and zinc oxide (ZnO) including at least 25 mol % of zinc oxide (ZnO), or a mixture of gallium oxide ($Ga_2O_3$) and indium oxide ($In_2O_3$) including at least 25 mol % of indium oxide ($In_2O_3$) shows the conductive properties. Accordingly, as shown in FIG. 7, the first and second touch electrodes (TE, RE) and the first and second touch lines (TL, RL) may be formed of the zinc oxide (Zn), the indium oxide ($In_2O_3$), the mixture of gallium oxide ($Ga_2O_3$) and zinc oxide (ZnO) including at least 25 mol % of zinc oxide (ZnO), or the mixture of gallium oxide ($Ga_2O_3$) and indium oxide ($In_2O_3$) including at least 25 mol % of indium oxide ($In_2O_3$). In this instance, the first and second insulating films (INS1, INS2) may be formed of the mixture of gallium oxide ($Ga_2O_3$) and zinc oxide (ZnO) including at least 75 mol % of gallium oxide ($Ga_2O_3$), or the mixture of gallium oxide ($Ga_2O_3$) and indium oxide ($In_2O_3$) including at least 75 mol % of gallium oxide ($Ga_2O_3$), as shown in FIG. 7.

That is, if the touch sensing layer 283 is formed by the ion implantation process, it may be formed of an inorganic film. Accordingly, the touch sensing layer 283 is formed of some area of the inorganic film of the encapsulation film 280 so that it is possible to minimize the increase of thickness in the display device with integrated touch screen caused by the touch sensing layer 283.

Meanwhile, the touch sensing layer 283 is formed of the inorganic film so that it is possible to prevent moisture or oxygen from being permeated into an organic light emitting layer 262 and a second electrode 263. Accordingly, it is possible to remove the first and second inorganic films 281 and 284 and the organic film 283 from the encapsulation film 280, that is, it is possible to provide only the touch sensing layer 283 in the encapsulation film 280.

A method for forming the touch sensing layer 283 by the ion implantation process is the same as that of FIG. 10, whereby a detailed description for the method will be omitted.

As described above, the touch sensing layer 283 of the inorganic film may be formed in the encapsulation film 280 by the ion implantation process. As a result, the touch sensing layer 283 is formed of some area of the inorganic film of the encapsulation film 280 so that it is possible to minimize the increase of thickness in the display device with integrated touch screen caused by the touch sensing layer 283.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. A display device with an integrated touch screen, the display device comprising:
    a first substrate including a display area and a non-display area;
    a thin film transistor on the first substrate and including a gate electrode, a source electrode and a drain electrode;
    a first electrode on the thin film transistor;
    an organic light emitting layer on the first electrode;
    a second electrode on the organic light emitting layer; and
    an encapsulation film on the second electrode,
    wherein the encapsulation film includes at least one inorganic film, an organic film, a first touch sensing layer and a first insulating film disposed in the display area, and a touch line extending from the first touch sensing layer in the non-display area,
    the first touch sensing layer includes a first touch electrode and a second touch electrode,
    the first touch electrode, the second touch electrode, and the first insulating film are coplanar,
    the first insulating film is disposed between the first touch electrode and the second touch electrode,
    the touch line is connected with a pad provided on the same layer as any one of the gate electrode, the source electrode and the drain electrode, and
    the first insulating film is not overlapped with the first touch electrode and the second touch electrode.

2. The display device according to claim 1, wherein an upper surface of the first touch electrode, an upper surface of the second touch electrode, and an upper surface of the first insulating film are flat.

3. The display device according to claim 1, wherein the first insulating film among the first touch electrode, the second touch electrode, and the first insulating film that are coplanar becomes a non-conductor by an ion implantation process.

4. The display device according to claim 1, wherein the first and second touch electrodes among the first touch electrode, the second touch electrode, and the first insulating film that are coplanar become conductors by an ion implantation process.

5. The display device according to claim 1, wherein the at least one inorganic film includes: a first inorganic film disposed between the second electrode and the first touch sensing layer; and
    wherein the organic film is disposed between the first inorganic film and the first touch sensing layer.

6. The display device according to claim 5, further comprising a dam provided to prevent the organic film from overflowing into the pad,
    wherein the touch line extends across the top of the dam to an upper surface of the pad.

7. The display device according to claim 1, wherein the encapsulation film further includes a second inorganic film on the first touch sensing layer.

8. The display device according to claim 1, wherein the encapsulation film further includes a second touch sensing layer having a bridge electrode for electrically connecting the first touch electrode and another neighboring first touch electrode with each other.

9. The display device according to claim 8, wherein the encapsulation film further includes a second insulating film disposed between the bridge electrode and another neighboring bridge electrode.

10. The display device according to claim 9, wherein the second insulating film is disposed between the second touch electrode and the bridge electrode.

11. The display device according to claim 9, wherein the bridge electrode and the second insulating film are coplanar.

12. The display device according to claim 11, wherein an upper surface of the bridge electrode and an upper surface of the second insulating film are flat.

13. The display device according to claim 11, wherein the second insulating film among the bridge electrode and the second insulating film that are coplanar becomes a nonconductor by an ion implantation process.

14. The display device according to claim 11, wherein the bridge electrode among the bridge electrode and the second insulating film that are coplanar becomes a conductor by an ion implantation process.

15. The display device according to claim 1, wherein an upper surface of the first touch electrode, an upper surface of the second touch electrode, and an upper surface of the first insulating film are provided at the same height.

16. The display device according to claim 1, wherein the encapsulation film further includes a second inorganic film disposed on the first touch sensing layer and covering the first touch sensing layer.

17. The display device according to claim 1, wherein the first insulating film, the first touch electrode, and the second touch electrode abut each other in the same layer, and have the same thickness.

* * * * *